United States Patent
Okabe et al.

(10) Patent No.: US 6,368,944 B1
(45) Date of Patent: Apr. 9, 2002

(54) METHOD OF MANUFACTURING PHOTOVOLTAIC ELEMENT AND APPARATUS THEREFOR

(75) Inventors: Shotaro Okabe, Nara; Yasushi Fujioka, Kyoto; Masahiro Kanai, Kyoto; Akira Sakai, Kyoto; Tadashi Sawayama, Kyoto; Yuzo Kohda, Kyotanabe; Tadashi Hori, Nara; Takahiro Yajima, Kyoto, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/664,219

(22) Filed: Sep. 18, 2000

Related U.S. Application Data

(62) Division of application No. 08/923,259, filed on Sep. 4, 1997, now Pat. No. 6,162,988.

(30) Foreign Application Priority Data

Sep. 5, 1996 (JP) .............................................. 8-255535

(51) Int. Cl.[7] .............................................. H01L 21/20
(52) U.S. Cl. .......................................... 438/482; 257/72
(58) Field of Search ............................. 438/69, 96, 97, 438/482, 488; 257/72

(56) References Cited

U.S. PATENT DOCUMENTS

| | | | | |
|---|---|---|---|---|
| 4,239,554 A | * | 12/1980 | Yamazaki | 136/255 |
| 4,400,409 A | | 8/1983 | Izu et al. | 427/39 |
| 4,609,771 A | | 9/1986 | Guha et al. | 136/249 |
| 4,737,196 A | | 4/1988 | Yukimoto | 136/249 |
| 4,875,943 A | | 10/1989 | Hamakawa et al. | 136/244 |
| 4,875,944 A | | 10/1989 | Yoshida | 136/249 |
| 4,920,917 A | | 5/1990 | Nakatani et al. | 118/718 |
| 4,948,436 A | | 8/1990 | Juergens | 136/249 |
| 5,456,762 A | * | 10/1995 | Kariya et al. | 136/258 |
| 5,589,007 A | | 12/1996 | Fujioka et al. | 136/249 |
| 5,676,765 A | * | 10/1997 | Saito et al. | 136/258 |
| 5,913,986 A | * | 6/1999 | Matsuyama | 136/255 |
| 6,025,039 A | | 2/2000 | Yajima | 427/573 |
| 6,215,061 B1 | * | 4/2001 | Kariya | 136/256 |

FOREIGN PATENT DOCUMENTS

JP 62-209871 9/1987

OTHER PUBLICATIONS

Patent Abstracts of Japan, vol. 013, No. 099 (E–724), Mar. 8, 1989 (corresponds to JP 63–274184).
Patent Abstracts of Japan, vol. 013, No. 051 (E–712), Feb. 6, 1989 (corresponds to JP 63–244889).

* cited by examiner

*Primary Examiner*—David Nelms
*Assistant Examiner*—Quoc Hoang
(74) *Attorney, Agent, or Firm*—Fitzpatrick, Cella, Harper & Scinto

(57) ABSTRACT

The photovoltaic element of the present invention is a photovoltaic element comprised of a semiconductor-junctioned element, characterized in that the element includes a first electrically conductive type semiconductor layer, a non-crystalline i type semiconductor layer, a microcrystalline i type semiconductor layer and a microcrystalline second electrically conductive type semiconductor layer and is pin-junctioned, and a method of and an apparatus for manufacturing the same are characterized by efficiently and continuously mass-producing the photovoltaic element having an excellent current-voltage characteristic and excellent photoelectric conversion efficiency. Thereby, there are provided a photovoltaic element in which the junction interface between the non-crystalline i type layer and the microcrystalline electrically conductive type layer has good grating consistency and which has an excellent current-voltage characteristic and excellent photoelectric conversion efficiency, and a method of and an apparatus for continuously mass-producing the same.

6 Claims, 11 Drawing Sheets

METHOD OF MANUFACTURING PHOTOVOLTAIC ELEMENT AND APPARATUS THEREFOR

This application is a divisional of application Ser. No. 08/923,259, filed Sep. 4, 1997, now U.S. Pat. No. 6,162,988.

BACKGROUND OF THE INVENTION

1. Field of the Invention

This invention relates to a photovoltaic element using a non-monocrystalline semiconductor, and a method of and an apparatus for continuously forming the non-monocrystalline semiconductor layer of the photovoltaic element by the plasma CVD method. Particularly, it relates to a method of and an apparatus for mass producing photovoltaic elements such as solar cells using a roll to roll apparatus.

2. Related Background Art

There are various means for improving the photoelectric conversion efficiency of a photovoltaic element using a non-crystalline semiconductor, and it is necessary to improve the characteristics of a p type semiconductor layer, an i type semiconductor layer, an n type semiconductor layer, a transparent electrode, a back electrode, etc. constituting a photovoltaic element using the pin type semiconductor junction.

Particularly, regarding a so-called doping layer such as a p type semiconductor layer or an n type semiconductor layer, it is first required that the density of an activated acceptor or a donor be high and activating energy be small. Thereby, the diffusing potential (built-in potential) when the pin junction is formed becomes great and the open voltage (Voc) of the photovoltaic element becomes great, and photoelectric conversion efficiency is improved.

Next, the doping layer basically does not contribute to the creation of a photocurrent and therefore, it is required that this layer not hinder the incidence of light onto the i type semiconductor layer creating a photocurrent. In order to reduce the absorption by the doping layer, it is important to make the optical band gap wide and make the film thickness of the doping layer small.

As the material of the doping layer having the characteristics as described above, mention may be made of group IV semiconductor material such as Si, SiC, SiN or SiO. Materials in a non-crystalline or microcrystalline form have been studied.

Above all, group IV semiconductor alloy materials having a great band gap have been considered to be suitable because of their small absorption coefficient, and microcrystalline or polycrystalline semiconductor materials have been considered to be suitable because of their small absorption coefficient and small activating energy.

On the other hand, it is required that the interfacial level on the junction interface of homogeneous or heterogeneous junction formed between the doping layer and the i type semiconductor layer be small.

However, the grating consistency between the i type semiconductor layer and the microcrystalline or polycrystalline p type semiconductor layer is not good and therefore, a junction interfacial level is created.

Therefore, a significant reduction in the running property of carries and fill factor (FF) exists and improvement therein has become a task.

As a method of improving mass productivity, a continuous plasma CVD method adopting a roll to roll system is disclosed in U.S. Pat. No. 4,400,409.

According to this method, with a long belt-like member as a substrate, the substrate is continuously conveyed in the lengthwise direction while electrically conductive type semiconductor layers required in a plurality of glow discharging areas are accumulated and formed. An element having semiconductor junction can thus be continuously formed.

FIG. 8 of the accompanying drawings is a schematic view of a typical plasma CVD apparatus of the roll to roll type for successively laminating n, i and p type semiconductor layers to thereby form a photovoltaic element of the single cell type.

The reference numeral 801 designates the whole of an accumulated film forming apparatus. The reference numeral 802 denotes a long electrically conductive magnetic material belt-like member, the reference numeral 803 designates a pay-away chamber for the belt-like member, the reference numeral 804 denotes a take-up chamber for the belt-like member, and the reference numerals 805 to 807 designate accumulated film forming chambers, the reference numeral 805 denoting a chamber for forming an n type layer, the reference numeral 806 designating a chamber for forming an i type layer, and the reference numeral 807 denoting a chamber for forming a p type layer. The reference numeral 809 designates a discharge space. The reference numeral 808 denotes a gas gate, and the reference numerals 810 and 811 designate bobbins.

The procedure of forming semiconductor film will hereinafter be described with reference to FIG. 8.

The accumulated film forming apparatus 801 has the pay-away chamber 803 for the belt-like member 802 and the take-up chamber 804 for the belt-like member 802 disposed at the opposite ends thereof. The accumulated plasma CVD film forming chambers 805, 806 and 807 by the plasma for forming a plurality of semiconductor layers are connected in series through the gas gate 808 between the pay-away chamber and the take-up chamber. Scavenging gas such as $H_2$ gas is introduced into the gas gate 808 and forms a pressure barrier relative to the accumulated film forming chambers at the opposite ends, and the diffusion of the gas between the chambers can be prevented, and this forms a feature of the roll to roll type film forming apparatus. A material gas is supplied to each accumulated film forming chamber, and discharge can be caused in the discharge space 809 by the inputting of high frequency wave or microwave electric power.

Also, each accumulated film forming chamber has exhaust means and a pressure regulating valve and can be maintained in a reduced pressure state of predetermined pressure.

In actual film formation, the long belt-like member 802 is paid away from the pay-away chamber 803 and is passed over the pay-away chamber 804, and semiconductor layers can be successively accumulated and formed in the discharging space of the accumulated film forming chambers 805, 806 and 807 while the belt-like member 802 is continuously paid away and moved.

Also, a photovoltaic element of the tandem cell type can be made by adopting a chamber construction in which the n, i and p type layer forming chambers are repetitively arranged.

SUMMARY OF THE INVENTION

So, the present invention has as its object to provide a photovoltaic element in which the junction interface between a non-crystalline i type layer and a microcrystalline electrically conductive type layer has good grating consistency and which has an excellent current-voltage characteristic and excellent photoelectric conversion efficiency by the use of a roll to roll apparatus for improving mass productivity, and a method of and an apparatus for continuously mass-producing such photovoltaic elements.

The photovoltaic element of the present invention is a photovoltaic element comprised of a semiconductor-junctioned element, characterized in that the element includes a first electrically conductive type semiconductor layer, a non-crystalline i type semiconductor layer, a microcrystalline i type semiconductor layer and a second electrically conductive type semiconductor layer comprising microcrystal, and is pin-junctioned.

The photovoltaic element of the present invention is characterized in that the semiconductor layers thereof are formed chiefly of silicon, and the non-crystalline i type semiconductor layer includes germanium. Also, the photovoltaic element of the present invention is characterized in that the element is constructed so as to have a plurality of pin junctions.

Also, the photovoltaic element of the present invention is characterized in that the second electrically conductive type semiconductor layer is constructed so as to be located on the light incidence side.

Also, it is characterized in that the second electrically conductive type semiconductor layer is a p type layer.

Also, it is preferable that the layer thickness of the microcrystalline i type semiconductor layer be 50 to 100 Å.

Also, it is preferable that the layer thickness of the microcrystalline p type semiconductor layer be 80 to 150 Å.

Also, it is characterized in that the impurity density of the microcrystalline p type semiconductor layer is $10^{21}$ atoms/$cm^3$ or greater on the outermost surface thereof, and this impurity density decreases toward the microcrystalline i type semiconductor layer.

Also, it is preferable that the microcrystalline i type semiconductor layer be constructed so that an area in which the atomic density thereof is $10^{18}$ atoms/$cm^3$ or less may have a thickness of at least 30 Å.

Next, the method of manufacturing the photovoltaic element of the present invention is characterized by forming a first electrically conductive type semiconductor layer on a long substrate, forming a non-crystalline i type semiconductor layer thereon, forming a microcrystalline i type semiconductor layer thereon by the high frequency plasma CVD method, and forming a second electrically conductive type semiconductor layer comprising microcrystals thereon by the high frequency plasma CVD method.

Also, it is preferable that the formation of the microcrystalline i type semiconductor layer be done with $SiH_4$ and $H_2$ as raw material gases, the amount of supply of $H_2$ to $SiH_4$ be 50 times or greater, and the magnitude of high frequency electric power applied to the raw material gases be 0.2 W/$cm^2$ or greater.

Also, it is preferable that the formation of the microcrystalline p type semiconductor layer be done with $SiH_4$, $H_2$ and $BF_3$ as raw material gases, the amount of supply of $H_2$ to $SiH_4$ be 50 times or greater, the amount of supply of $BF_3$ to $SiH_4$ be 10 to 50%, and the magnitude of high frequency electric power applied to the raw material gases be 0.01 to 0.03 W/$cm^2$.

Also, it is preferable that the formation temperature of the microcrystalline i type semiconductor layer be below the formation temperature of the non-crystalline i type semiconductor layer, and the formation temperature of the microcrystalline i type semiconductor layer be 180 to 240° C.

Also, it is characterized in that the non-crystalline i type semiconductor layer be formed by the microwave plasma CVD method.

Also, it is characterized in that the non-crystalline i type semiconductor layer have an i type layer formed by the microwave plasma CVD method, and an i type layer formed by the high frequency plasma CVD method.

Further, one form of the apparatus for manufacturing the photovoltaic element of the present invention is an accumulated film forming apparatus for continuously accumulating a plurality of semiconductor layers on a long substrate by the plasma CVD method, characterized by at least a first accumulating chamber having means for letting a raw material gas flow from the upper part toward the lower part in the direction of movement of the long substrate, and a second accumulating chamber having means for letting the raw material gas from the lower part toward the upper part in the direction of movement of the long substrate, the first accumulating chamber and the second accumulating chamber being connected together by a separating path.

Also, it is characterized in that the area of at least an electrode in the second accumulating chamber for applying electric power for creating plasma is larger than the area of the long substrate in the accumulating chamber.

Also, it is characterized in that the electrode is of a fin-like shape or an enclosure-like shape.

Also, it is characterized in that the potential of the electrode is positive relative to the long substrate.

Also, it is characterized in that a portion for supplying the raw material gas into the accumulating chambers has a member for shielding the long substrate from the flow of the raw material gas.

Another form of the apparatus for manufacturing the photovoltaic element of the present invention is an accumulated film forming apparatus for forming accumulated film by the plasma CVD method, characterized in that the area of an electrode for applying electric power for creating plasma is larger than the area of a substrate in an accumulating chamber.

Also, it is characterized in that the electrode is of a fin-like shape or an enclosure-like shape.

Also, it is characterized in that the potential of the electrode is positive relative to the long substrate.

Also, it is characterized in that a portion for supplying the raw material gas into the accumulating chamber has a member for shielding the long substrate from the flow of the raw material gas.

DESCRIPTION OF THE PREFERRED EMBODIMENTS

Figure 1:
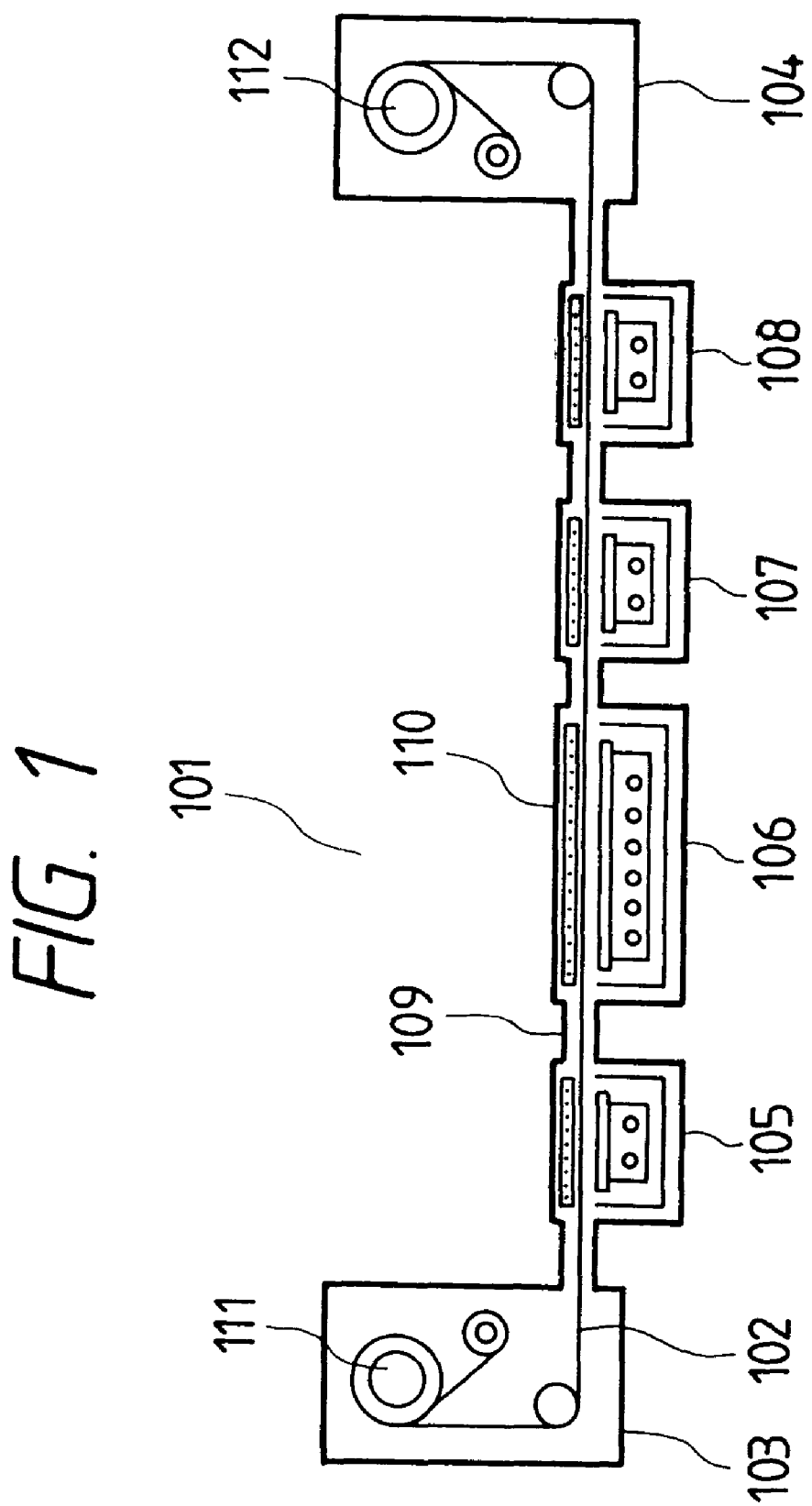
FIG. 1 shows an apparatus for forming the silicon single cell type photovoltaic element of the present invention.

In order to improve the grating consistency of a non-crystalline i type semiconductor layer and a microcrystalline second electrically conductive type layer, a microcrystalline i type semiconductor layer is provided between the non-crystalline i type semiconductor layer and the microcrystalline second electrically conductive type layer, whereby a grating constant is smoothly varied, or stepwise gradually varied, in the direction of layer thickness from the non-crystalline to the microcrystalline.

That is, this microcrystalline i type semiconductor layer, as compared with the non-crystalline i type semiconductor layer, is approximate to the grating constant of the microcrystalline second electrically conductive type layer. Therefore, it can function as good groundwork for the formation of the microcrystalline second electrically conductive type layer, and can expedite the formation of the second electrically conductive type layer as microcrystalline and can form microcrystalline film of good quality and uniform quality having few structural defects such as voids, cracks and pinholes.

Also, in the content of higher impurity density, the microcrystalline property thereof can be confirmed.

Therefore, by using this microcrystalline i type semiconductor layer, the layer thickness of the second electrically conductive type layer can be made smaller, and in the photoelectric conversion characteristic of the photovoltaic element, a short-circuiting electric current is increased and the fill factor is improved.

Further, by the presence of this microcrystalline i type semiconductor layer, during the making of the element, diffusion of a second electrically conductive type impurity from the microcrystalline second electrically conductive type layer to the non-crystalline i type layer, can be suppressed and the uniformity and reproducibility of the element performance during mass production or manufacture are improved.

Specifically, in a photoelectromotive power element adopting, for example, non-crystalline i type silicon in a carrier creating layer, silicon as a microcrystalline i type layer and p type silicon as a second electrically conductive type layer are laminated thereon, or when non-crystalline i type silicon germanium is adopted in the carrier creating layer, a non-crystalline i type silicon germanium layer, a microcrystalline i type silicon layer and a microcrystalline p type silicon layer are laminated, can be realized.

The above-described forms of crystal are obtained by the following method.

The microcrystalline i type layer is formed by the high frequency plasma CVD method. A belt-like member is used as an anode electrode, an electrically conductive flat plate opposed thereto is used as a cathode electrode for applying high frequency electric power, and the area sandwiched by and between the two electrodes becomes a discharging space. A raw material gas is supplied to this discharging space, and discharging is caused and maintained.

The i type semiconductor layer in the present invention is Si. A gas containing silicon such as $SiH_4$, or $Si_2H_6$ and $H_2$, are supplied as the raw material gas to the discharge space.

The present invention is characterized by the manner in which the material gas flows in the microcrystalline i type semiconductor layer forming chamber and the microcrystalline second electrically conductive type forming chamber.

In the formation of the microcrystalline i type semiconductor layer, the material gas is introduced from the direction of the upper part along the direction of movement of the belt-like member and is made to flow toward the lower part (the p layer side), whereby the discharge in the lower portion of the discharge space has a lower density of $SiH_4$ relative to the discharge in the upper portion (the dilution ratio by $H_2$ increases. Thus, the discharging state of the upper portion becomes advantageous for microcrystallization relative to the lower portion.

In other words, the formation speed of accumulated film (in the portion which is in contact with the p type layer) formed in the lower portion becomes relatively small, and the microcrystallization of the film accumulated on the non-crystal i type layer is expedited.

Also, in the formation of the second electrically conductive type layer (p type layer), as the material gas, use is made, for example, of gas such as $SiH_4$ or $Si_2H_6$ containing silicon, gas such as $BF_3$ or $B_2H_6$ containing a dopant (p type impurity) and diluting gas.

The dilution ratio by hydrogen gas to a gas containing silicon is high. By use of the application of high frequency electric power as a film forming condition, the accumulation of the microcrystallized film is expedited.

The material gas is introduced from the lower part (take-up side) in the direction of movement of the belt-like member into the discharge space and is made to flow toward the upper part (the i layer side) (the i layer side becomes the downstream side of the gas), whereby the accumulation speed of the p type semiconductor layer becomes such that the material gas containing silicon tends to run dry (the dilution ratio of $H_2$ is high) in a portion (downstream) proximate to the i type layer and therefore, the formation of microcrystallized accumulated film is relatively expedited.

The microcrystalline second electrically conductive type layer (p type semiconductor layer) is formed by the high frequency plasma CVD method.

By making the area of the cathode electrode in the discharging space larger than the area of the anode electrode, the potential (self-bias) of the cathode electrode during glow discharging can maintain a positive potential relative to the anode (grounded) electrode including the belt-like member.

By the potential (self-bias) of the cathode electrode being maintained at a positive potential, bias is applied in a direction in which ions having positive charges are applied to the accumulated film on the belt-like member and therefore, ions present in plasma discharge are more efficiently accelerated in the direction toward the belt-like member, and by the so-called ion bombardment, energy is efficiently given to the surface of the accumulated film with a result that the structural alleviation of the film is expedited even at a relatively high accumulation speed. The dopant is taken into silicon network at 4 coordination sites, and the quality and elaborateness of the film are improved and there can be obtained p type semiconductor thin film of high quality.

In order to make the surface area of the cathode electrode large, the cathode electrode can assume fin-like structure on a conventional flat electrode or enclosure-like structure.

Figure 6:
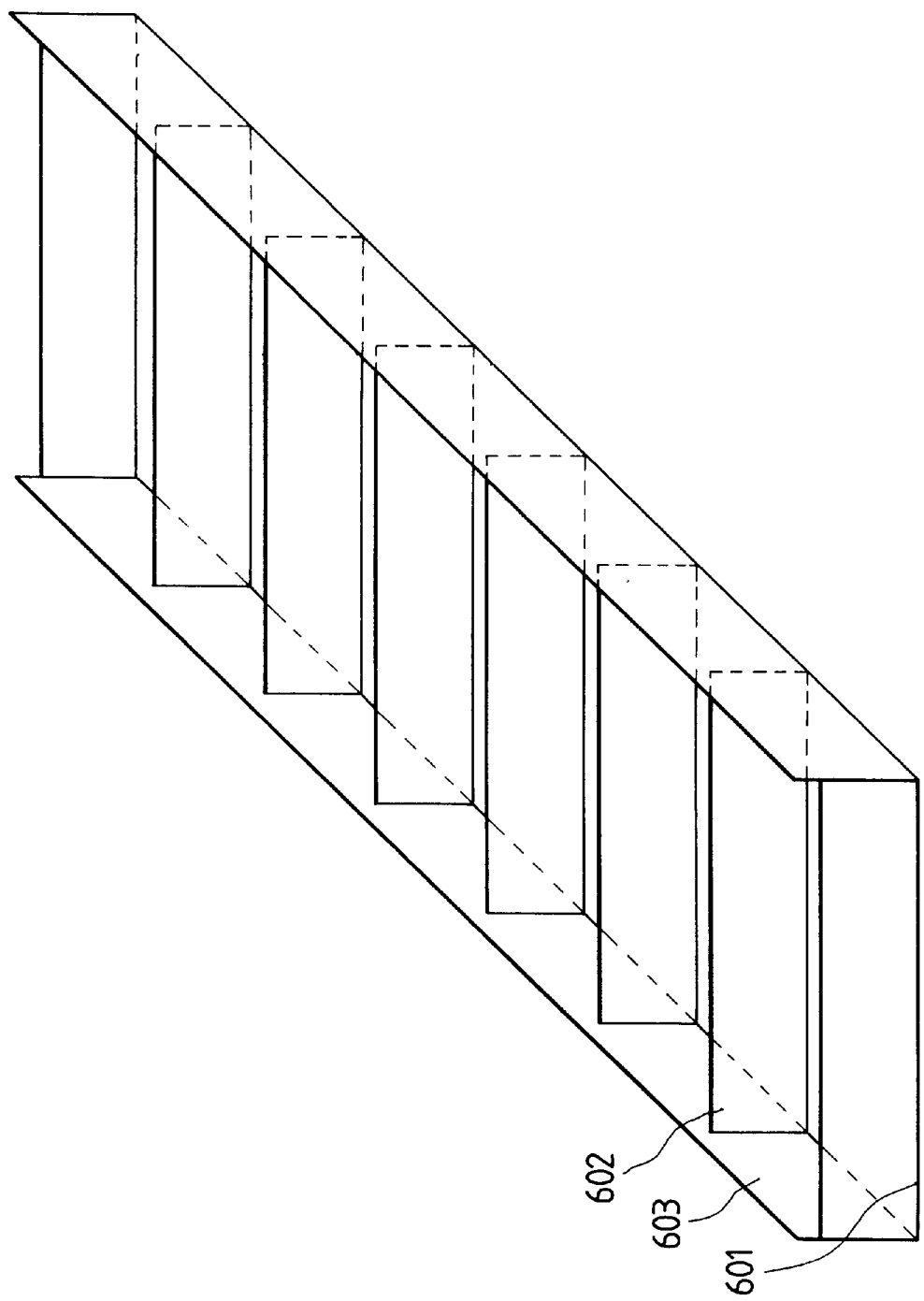
FIG. 6 shows the shape of a cathode electrode in the microcrystalline p type semiconductor layer forming chamber of the present invention.

FIG. 6 shows the afore-described fin-like cathode electrode. A plurality of portions of the fin-shaped cathode electrode are disposed perpendicularly to the direction of conveyance of the belt-like member and in parallel to each other. In FIG. 6, partition plates 602 are perpendicular to the direction of conveyance.

The fin-shaped electrode is formed of an electrically conductive material such as stainless steel. The spacing between the fin-shaped electrodes is sufficient for discharge to occur and be maintained between adjacent ones of the fin-shaped electrodes. The material gas is supplied from the lower part side in the direction of conveyance of the belt-like member and is made to flow toward the upper part above the fin-shaped electrodes (between the fin-shaped electrodes and the belt-like member).

The method of making the surface area of the cathode electrode large is not restricted to the above-described fin-shaped electrodes.

In the formation chamber for the microcrystalline i type layer and the microcrystalline second electrically conductive type layer, the decomposition of the material gas in the plasma does not progress around the position at which the material gas is emitted to the discharge space (the portion from which the material gas is supplied). If active species in the plasma in this portion are accumulated on the belt-like member, the microcrystallization will be hindered from being expedited, film of low electrical conductivity will be accumulated, and the short-circuiting current and fill factor of the photovoltaic element will be reduced.

Accordingly, the portion around and just above the portion from which the material gas is supplied is shielded relative to the belt-like member so that the active species around the portion from which the material gas is supplied does not accumulate on the belt-like member, whereby a homogeneous microcrystalline i type layer of high electrical conductivity (high carrier running property) and a homogeneous microcrystalline i type layer of high electrical conductivity and small light absorbing coefficient can be formed, thus contributing to improving the photoelectric converting characteristic of the photovoltaic element.

To make the photovoltaic element of the present invention function more effectively, of course the high quality and reproducibility of the film of the individual semiconductor layers must be ensured. When the semiconductor layers are to be successively formed by an apparatus of the roll to roll type, the independence of the formation atmosphere of the non-crystal i type layer, the microcrystalline i type layer and the microcrystalline second electrically conductive type layer must be sufficiently secured.

Therefore, it is preferable to individually provide discharge spaces for forming the non-crystalline i type layer, the microcrystalline i type layer and the microcrystalline second electrically conductive type layer.

Also, if the discharge spaces are formed in discrete chambers and the adjacent chambers are connected together through a gas gate, the independence of the atmosphere will be further improved.

The high frequency plasma CVD method is used for the formation of the microcrystalline i type layer.

A discharge furnace uses a belt-like member as an anode electrode, and an electrically conductive flat plate type cathode electrode for applying a high frequency is provided in opposed relationship with the accumulated film forming surface of the belt-like member, and the space between the two electrodes is used as a discharge space.

The material gas is supplied to the discharge space and pressure can be reduced by exhaust means.

The main points of the formation condition for the microcrystalline i type layer are the amount of supply of the raw material gas and the density of supplied electric power, and the method of supply of the material gas to the discharge space.

As the material gas supplied to the discharge space, use is made of silicon hydride gas, for example, $SiH_4$, $Si_2H_6$ or the like.

The silicon hydride gas is diluted by hydrogen ($H_2$) gas and high frequency electric power of a predetermined value or greater is applied thereto, whereby the formation of a microcrystallized i type layer is expedited.

That is, the amount of supply of the material gas $H_2$ supplied to the discharge space is made 50 times as great as $SiH_4$ or greater, and the electric power density of the supplied high frequency (13.56 MHz) is 0.2 $W/cm^2$ or greater relative to the surface area of the cathode electrode.

It is suitable as the groundwork for expediting the formation of the microcrystalline p type layer that the layer thickness of the microcrystallized i type layer is 5 nm to 15 nm.

If the layer thickness is less than 5 nm, it will be insufficient for a microcrystalline layer to be formed. If the layer thickness is greater than 15 nm, the amount of light absorbed in the i type microcrystalline layer before the light arrives at the non-crystalline i type layer which is a carrier creating layer cannot be ignored, and the microcrystalline i type layer will act as a resisting component in the photoelectric converting characteristic of the photovoltaic element, and a reduction in the fill factor cannot be ignored.

The material gas is introduced from the upper part direction into the discharge space along the direction of movement of the belt-like member and is made to flow in the lower part direction (toward the p layer side), whereby $SiH_4$ gas chiefly contributing to accumulation is dissociated in the discharge space and is accumulated on the belt-like member and consumed while flowing from the upper part to the lower part. In the discharge in the lower part, the density of the active species or the ion species containing $SiH_4$ or Si decreases relative to the discharge in the upper part (the dilution ratio by $H_2$ heightens). Consequently, the condition for the formation of more microcrystallized film is prepared for the film accumulated and formed in the lower part (the i type layer portion which is in contact with the second electrically conductive type layer (p type layer)), and the formation of homogeneous microcrystalline film of good quality is expedited.

Also, the discharge in the upper part, as compared with the discharge in the lower part, is approximate to the state of the discharge used for the formation of the groundwork non-crystalline i type film, and the film formed on the non-crystalline i type layer formed by the discharge in the upper part has the effect of improving the grating consistency with the non-crystalline i type layer.

The high frequency plasma CVD method is also used for the formation of the microcrystalline second electrically conductive type layer (p type layer).

The main points of the formation condition of the microcrystalline second electrically conductive type layer (p type layer) are the amount of supply of the material gas, the density of the supplied electric power and the method of supplying the material gas to the discharge space.

The p type layer is formed while the potential (self-bias) of the cathode electrode during the occurrence of glow discharge maintains positive potential of +V or greater relative to the anode (grounded) electrode including the belt-like member, whereby bias is applied to the accumulated film on the belt-like member in a direction in which ions having positive charges are applied. Therefore the ions present in the plasma discharge are accelerated more efficiently toward the belt-like member, and energy is effectively given to the surface of the accumulated film by the so-called ion bombardment with a result that even at a relatively high accumulation speed, the structural alleviation of the film is expedited and the dopant is taken into the silicon network at 4 coordination sites. The good quality and elaborateness of the film are improved, whereby there can be obtained p type semiconductor thin film of high quality.

In order to maintain the potential (self-bias) of the cathode electrode at positive potential, the surface area of the cathode electrode in the discharge space need be larger than the surface area of the entire anode electrode including the surface area of the belt-like member in the discharge space.

In order to make the surface area of the cathode electrode large, the cathode electrode can assume, for example, a fin-like structure. FIG. 6 shows the fin-like cathode electrode.

A plurality of portions of the fin-shaped cathode electrode are disposed perpendicularly to the direction of conveyance of the belt-like member and in parallel to one another.

The fin-shaped electrodes are formed of an electrically conductive metal material such as stainless steel.

The spacing between the fin-shaped electrodes is sufficient for discharge to occur and be maintained between the adjacent fin-shaped electrodes.

The material gas is supplied from the lower part side in the direction of conveyance of the belt-like member and is made to flow toward the upper part on the fin-shaped electrodes (between the electrodes and the belt-like member).

The shape of the fin is not limited to the afore-described one, but can assume, for example, the shapes as will be described below.

For example, it can adopt such structure that the material gas flows under the fin-shaped electrodes.

Also, there can be disposed fin-shaped electrodes intersecting perpendicularly (i.e., in the direction of movement of the belt-like member) to the fin-shaped electrodes perpendicular to the direction of conveyance of the belt-like member, whereby the area of the cathode can be made larger. The shape of the cathode electrode is not limited to the fin-like shape, but may be a concavo-convex shape or a block-like shape or a needle-like shape.

As the material gas supplied to the discharge space, use is made of silicon hydride gas such as $SiH_4$ or $Si_2H_6$, $BF_3$ or $B_2H_6$ containing second electrically conductive type (p type) impurity (dopant), and hydrogen ($H_2$) gas diluting the aforementioned gas.

Of the material gas supplied to the discharge space, the amount of supply of $H_2$ gas is made 50 times as great as the amount of supply of $SiH_4$ gas or greater. High frequency electric power is supplied to the discharge space and the self-bias of the cathode electrode forms positive (desirably +100 V or higher) discharge, whereby there can be formed microcrystalline p type semiconductor film of high quality within a range in which the density of $BF_3$ relative to $SiH_4$ gas is 0% to 100%.

However, if the density of $BF_3$ is 10% or less, the absolute amount of the dopant taken into the film will be deficient, thus resulting in a reduced open voltage.

The thickness of the layer can be made great to thereby cover the absolute amount of the dopant, but this will result in the loss of the quantity of light by the light absorption into the p type layer and an increase in a resistance component (fill factor).

Also, if the density exceeds 50%, excessive dopant will be incorporated into the silicon network at 3 coordination sites to thereby form a structural defect and the crystalline property will also be remarkably reduced to thereby cause a decrease in the short-circuiting current and a reduction in FF.

The film thickness may desirably be greater than 5 nm and less than 15 nm, and more desirably be 10 nm or less.

The material gas is introduced from the lower part (take-up side) in the direction of movement of the belt-like member into the discharge space and is made to flow toward the upper part (toward the i layer side), whereby the accumulation speed of the p type semiconductor layer becomes low near the i type layer because $SiH_4$ gas of the material gas tends to run dry there, and becomes high in the upper portion of the p type layer because this portion is near the supply position of the material gas.

On the i type layer, the p type layer is first formed at a relatively low accumulation speed, whereby the number of structural defects attributable to the grating consistency on the joint interface between the two layers can be decreased. In the upper portion of the p type layer, this can contribute to high productivity at a relatively high accumulation speed.

Also, on the outermost surface of the p type layer, sufficient impurity (dopant) density can be contained in the film, and in the current-voltage characteristic in the photoelectric conversion characteristic of the tandem type element, there can be obtained a good pn junction property.

Figure 3:
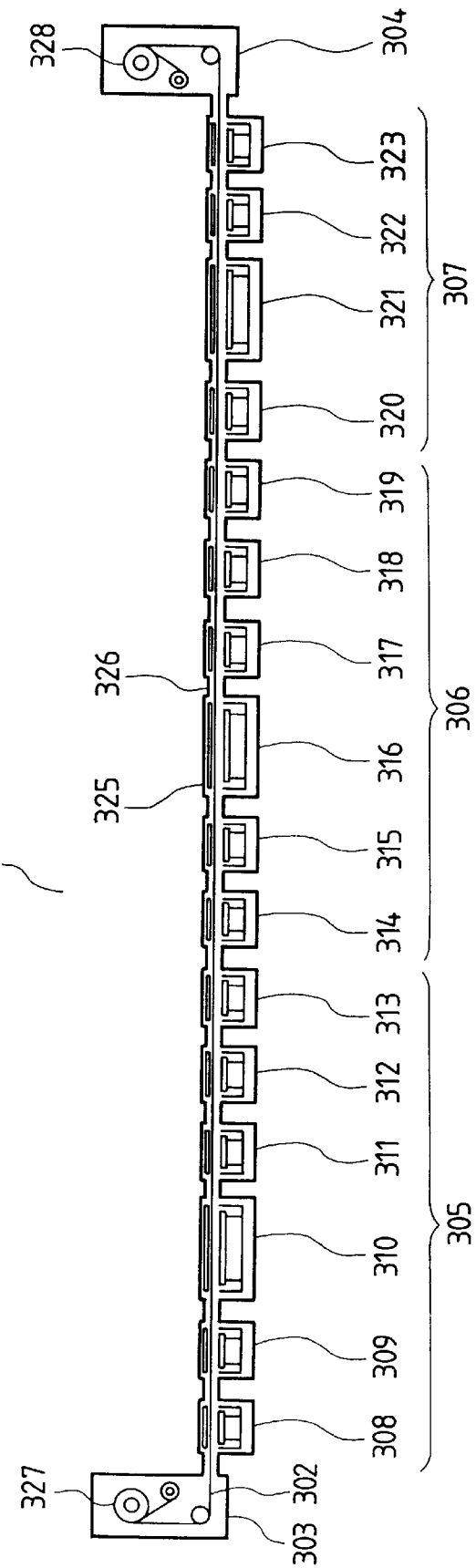
FIG. 3 shows an apparatus for forming the SiGe\SiGe\Si triple cell type photovoltaic element of the present invention.

FIG. 3 is a schematic view of a continuous plasma CVD apparatus of the roll to roll type for forming a photovoltaic element of the stack cell (triple cell) type.

Figure 2:
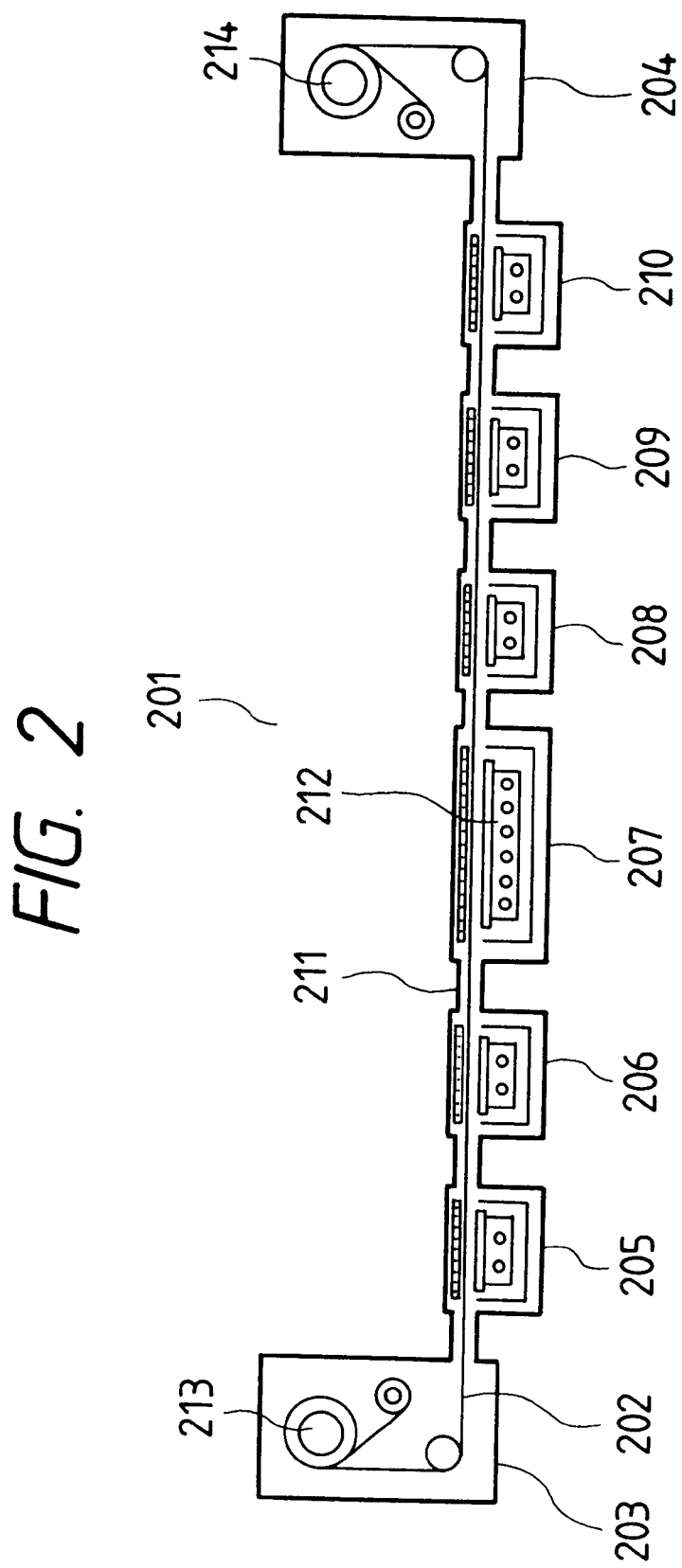
FIG. 2 shows an apparatus for forming the silicon germanium single cell type photovoltaic element of the present invention.

The cell can be made by a chamber construction in which the n, i and p type layer forming chambers in FIG. 2 are repetitively arranged.

To improve the electrical characteristic of the photovoltaic element by an improvement in the grating consistency, and secure the reproducibility of the performance of the element during the manufacture thereof, the control of the density of the impurity contained in the second electrically conductive type layer in the direction of thickness of the layer and the control of the diffusion and soaking of the impurity into the adjacent microcrystalline i type layer and the non-crystalline i type semiconductor layer during the manufacture of the element must be effected with good reproducibility.

When the above-mentioned semiconductor layer is to be formed by the roll to roll system, the independence of the formation atmosphere of the non-crystalline i type layer, the microcrystalline i type layer and the microcrystalline second electrically conductive type layer must be sufficiently secured to meet the above-described demand.

That is, in the present invention, the chambers for forming the non-crystalline i type layer, the microcrystalline i type layer and the microcrystalline second electrically conductive type layer are provided discretely from one another and connected together through a gas gate, whereby the above-described demand can be met.

When the microcrystalline second electrically conductive type layer is on the light incidence side, the loss of the incident light is smaller if the layer thickness is small, and more carrier can be created in the carrier creating layer.

The amount of impurity contained in the microcrystalline second electrically conductive type layer is the minimum necessary to produce a sufficient internal electric field and has density therein.

However, if high density of impurity is contained in a thin layer, a defect will be formed therein and the microcrystalline property will be reduced, and the electrical characteristic of the element will be reduced.

In the element of the present invention, the thickness of the microcrystalline second electrically conductive type layer need be 80–150 Å and the density of the impurity need be maximum $10^{21}$ atoms/cm$^3$ in the layer.

The density of the impurity in the second electrically conductive type layer is given a gradient so as to become highest, i.e., $10^{21}$ atoms/cm$^3$ or greater, on the light incidence side outermost surface and decrease toward the i type layer, whereby the grating consistency with the microcrystalline i type layer is further improved and the electrical characteristic (photoelectric conversion characteristic) of the element is further improved.

This density gradient of the impurity can be made by making a (discharging) spatial distribution in the density of the impurity containing gas when formed, for example, by the plasma CVD method (which premises the roll to roll method).

This density gradient also greatly improves the junction characteristic of the second electrically conductive type layer and the first electrically conductive type layer in the tandem cell.

In the present invention, the layer thickness of the microcrystalline i type semiconductor layer may suitably be 50–100 Å. When the layer thickness was less than 50 Å, the effect of expediting the microcrystallization of the second electrically conductive type layer did not occur, nor there was the effect of improving the grating consistency of the microcrystalline i type layer and the second electrically conductive type layer.

When the microcrystalline i type layer became more than 100 Å thick, this layer worked as a resistance layer to the running of the carrier and the electrical characteristic (photoelectric conversion characteristic) of the element appeared as a reduction in the fill factor. During the formation of the second electrically conductive type layer, the impurity cannot more or less avoid being diffused into the groundwork microcrystalline i type semiconductor layer under the high temperature thereof.

The fact that this second electrically conductive type impurity is diffused into the non-crystalline i type semiconductor layer which is the carrier creating layer may become the cause of the reproducibility of the electrical characteristic being not obtained in the mass production or manufacture of the element.

The fact that the layer thickness of the microcrystalline i type layer is 50 Å or greater is the minimum thickness for making the influence thereof small.

FIG. 1 is a schematic view showing the whole of a semiconductor layer forming apparatus according to the present invention for making an Si single cell type photovoltaic element.

In FIG. 1, the reference numeral 101 generally designates an accumulated film forming apparatus. The reference numeral 102 denotes a long electrically conductive belt-like member, the reference numeral 103 designates a pay-away chamber for the belt-like member, the reference numeral 104 denotes a take-up chamber for the belt-like member, the reference numeral 105 designates an n type semiconductor layer forming chamber, the reference numeral 106 denotes a non-crystalline i type Si layer forming chamber, the reference numeral 107 designates a microcrystalline i type Si layer forming chamber, and the reference numeral 108 denotes a microcrystalline p type semiconductor layer forming chamber. The reference numeral 110 designates a discharge space. The reference numeral 109 denotes a gas gate, and the reference numerals 111 and 112 designate bobbins.

Figure 4:
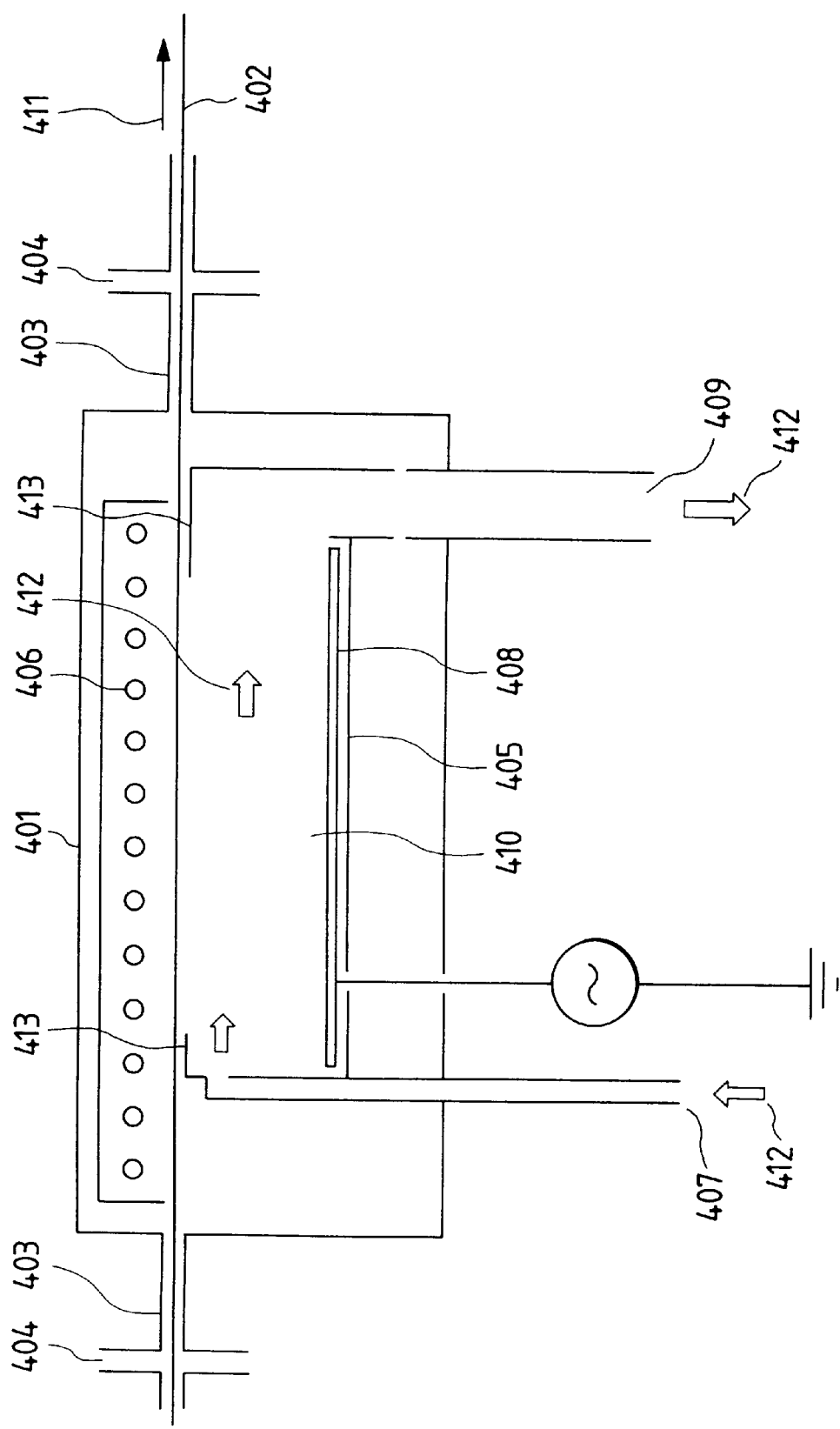
FIG. 4 shows the microcrystalline i type semiconductor layer forming chamber of the present invention.

FIG. 4 is a structural cross-sectional view of the microcrystalline i type Si semiconductor layer forming chamber. This is an accumulated film forming chamber using the high frequency plasma CVD method, and the n type semiconductor layer forming chamber 105 and the Si non-crystalline i type semiconductor layer forming chamber 106 in FIG. 1 have similar structure.

In FIG. 4, the reference numeral 401 designates an accumulated film forming chamber, the reference numeral 402 denotes a belt-like member, the reference numeral 403 designates a gas gate, the reference numeral 404 denotes gate gas introducing means, the reference numeral 405 designates a discharge furnace, the reference numeral 406 denotes belt-like member heating means (a lamp heater), the reference numeral 407 designates material gas supply means, the reference numeral 408 denotes a high frequency electrode (cathode electrode), the reference numeral 409 designates exhaust means, and the reference numeral 410 denotes a discharge area. The arrow 411 indicates the direction of movement of the belt-like member, and the arrow 412 indicates the direction in which the material gas flows.

The reference numeral 413 designates a shield member.

Description will now be made of the procedure of forming a microcrystalline i type layer by the microcrystalline i type Si semiconductor layer forming chamber 401 in FIG. 4. The accumulated film forming chamber 401 in which the belt-like member 402 is extended first exhausts to reduce pressure by exhaust means, not shown. Gate gas (such as $H_2$ or He) is made to flow from the gate gas introducing means 404 into the gas gate 403 between the neighboring chambers and the gas atmosphere with the adjacent chambers is isolated.

Next, material gas controlled to a predetermined amount of supply is introduced from the upper part in the direction of movement 414 of the belt-like member by the material gas introducing means 407 and is made to flow to the lower part side to thereby keep the pressure in the discharge furnace constant by pressure regulating means (a variable conductance valve, not shown). The belt-like member 402 and the discharge furnace 405 are controlled to predetermined temperatures by the belt-like member heating means 406 and the material gas and discharge furnace member heating means, not shown.

Subsequently, high frequency electric power is applied to the cathode electrode 410 to thereby cause discharge, and the material gas is decomposed and microcrystalline i type film is formed on the belt-like member while the belt-like member 402 is moved at a predetermined speed.

By the use of the accumulated film forming chamber of FIG. 4, microcrystalline i type Si semiconductor film was experimentally formed on the belt-like member made of stainless steel (SUS 430) on which non-crystalline Si was formed to 1000 Å.

The formation conditions were $SiH_4$ 10 sccm and $H_2$ 1000 sccm as the material gas, 13.56 MHz high frequency electric power 0.5 W/cm² (on the electrode), formation temperature 280° C. and pressure 1.3 Torr.

When the formed film was observed by means of RHEED, it was found to be microcrystallized.

The microcrystalline layer could also be confirmed by the observation of the cross-section of the accumulated film using a TEM (transmission type electronic microscope).

Further, a similar conclusion was also arrived at by the laser Raman spectrum method.

Figure 5:
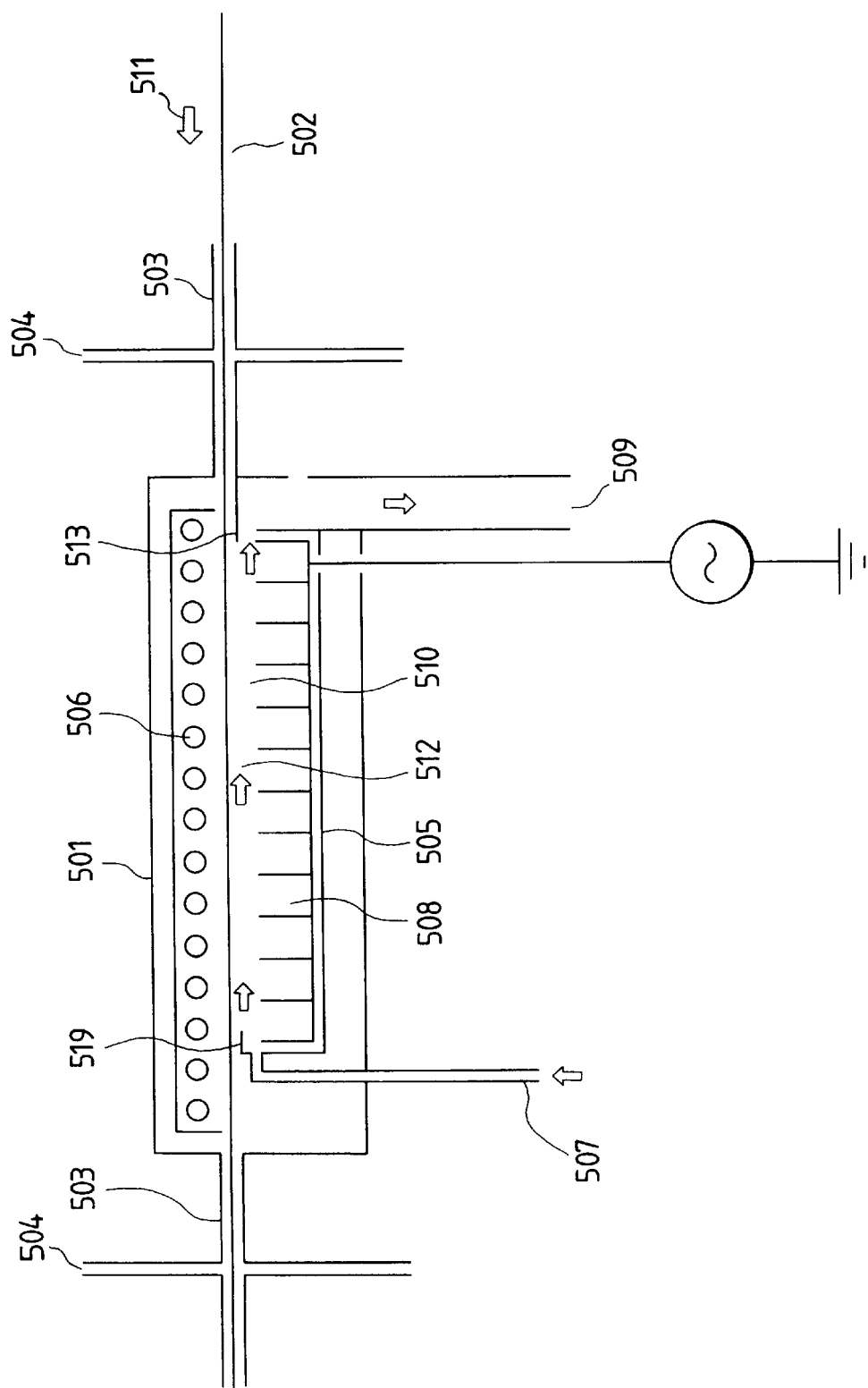
FIG. 5 shows the microcrystalline p type semiconductor layer forming chamber of the present invention.

FIG. 5 is a structural cross-sectional view of the microcrystalline p type semiconductor layer forming chamber in FIG. 1.

This is an accumulated film forming chamber using the high frequency plasma CVD method.

In FIG. 5, the reference numeral 501 designates an accumulated film forming chamber, the reference numeral 502 denotes a belt-like member, the reference numeral 503 designates a gas gate, the reference numeral 504 denotes gate gas introducing means, the reference numeral 505 designates a discharge furnace, the reference numeral 506 denotes belt-like member heating member (a lamp heater), the reference numeral 507 designates material gas supply means, the reference numeral 508 denotes a fin-shaped high frequency electrode (cathode electrode), the reference numeral 509 designates exhaust means, and the reference numeral 510 denotes a discharge area.

The arrow 511 indicates the direction of movement of the belt-like member, and the arrow 512 indicates the direction in which the material gas flows. The reference numeral 513 designates film formation area regulating means.

Description will now be made of the procedure of forming a microcrystalline p type semiconductor layer by the microcrystalline i type Si semiconductor layer forming chamber in FIG. 5.

The accumulated film forming chamber 501 in which the belt-like member 502 is extended first exhausts to reduced pressure by the exhaust means 511 (in which an exhaust pump, not shown, is outside).

Gate gas (such as $H_2$ or He) is made to flow from the gate gas introducing means 504 to the gas gate 503 between the neighboring chambers to thereby isolate the gas atmosphere with the adjacent chambers. Next, the material gas controlled to a predetermined amount of supply is introduced from the lower part in the direction of movement of the belt-like member by the material gas introducing means 509 and is made to flow to the upper part side, and the pressure in the discharge furnace is kept constant by pressure regulating means (a conductance regulating valve, not shown). The belt-like member 502 and the discharge furnace 505 are controlled to predetermined temperatures by the belt-like member heating means 506 and the material gas and discharge furnace member heating means, not shown.

Subsequently, high frequency electric power is applied to the cathode electrode 510 to thereby cause discharge, and the material gas is decomposed and microcrystalline p type film is formed on the belt-like member while the belt-like member 502 is moved at a predetermined speed.

By the use of the accumulated film forming chamber of FIG. 5, microcrystalline p type Si semiconductor film was experimentally formed on the belt-like member made of stainless steel (SUS 430) on which non-crystalline Si was formed to 1000 Å.

The formation conditions were $SiH_4$ 10 sccm, $H_2$ 3000 sccm and $BF_3$ 10 sccm as the material gas, 13.56 MHz high frequency electric power 0.5 W/cm² (per electrode area), formation temperature 200° C. and pressure 1.2 Torr.

When the formed film was observed by means of RHEED, it was found to be microcrystallized. A similar result was also obtained by the observation of the cross-section of the accumulated film using TEM. Further, a similar conclusion was also arrived at by the laser Raman spectrum method. Also, according to SIMS analysis, it was found that boron was contained in the film at a density of $10^{21}$ atoms/cma or greater.

Description will now be made of the procedure of making a Si single cell type photovoltaic element by the use of the apparatus of FIG. 1 using the roll to roll method.

First, the long electrically conductive magnetic material belt-like member 102 wound in the form of a roll on the bobbin 111 is extended from the pay-away chamber 103 to the take-up chamber 104 through the accumulated film forming chambers 105–108 and the gas gate 109 with tension applied in the form of a depending curve.

Magnet rollers (not shown) are installed in the gas gate 109 and in the accumulated film forming chambers 105–108 and attract the extended belt-like member 102 to thereby fix the track along which the belt-like member is moved.

Next, the apparatus 101 exhausts to reduced pressure of the order of $10^{-3}$ Torr by exhaust means, not shown, provided in each of the pay-away chamber 103 for the belt-like member 102, the take-up chamber 104 for the belt-like member, and the accumulated film forming chambers 105–108. In order to maintain the independency of the accumulated film formation conditions of the accumulated film forming chambers 105–108, inert gas or hydrogen gas is introduced as gate gas from gate gas introducing means (not shown) into the gas gate 109.

The material gas for forming accumulated film is introduced from gas supply means (not shown) into the accumulated film forming chambers 105–108, and the pressure in the chambers is controlled to a predetermined level by pressure regulating means (not shown) installed in an exhaust pipe (not shown).

The belt-like member 102 and the member in the discharge furnace 110 are controlled to the temperature of the accumulated film formation conditions by heating means (not shown) installed in the chambers 3–7.

High frequency electric power is applied to the cathode electrode of each chamber to thereby cause discharge in the discharge space.

Next, an n type semiconductor layer, a non-crystalline i type semiconductor layer, a microcrystalline i type semiconductor layer and a microcrystalline p type semiconductor layer are successively accumulated on the belt-like member while the belt-like member 102 is continuously paid away from the bobbin 111 in the pay-away chamber 103 and moved into the take-up chamber 104, thereby forming a Si single cell type photovoltaic element.

Also, the belt-like member 102 on which the photovoltaic element has been formed is sequentially taken up onto the bobbin 112 in the take-up chamber 104.

While the present invention will hereinafter be further described with respect to some embodiments thereof, the present invention is not restricted to the following embodiments.

Embodiment 1

Figure 9:
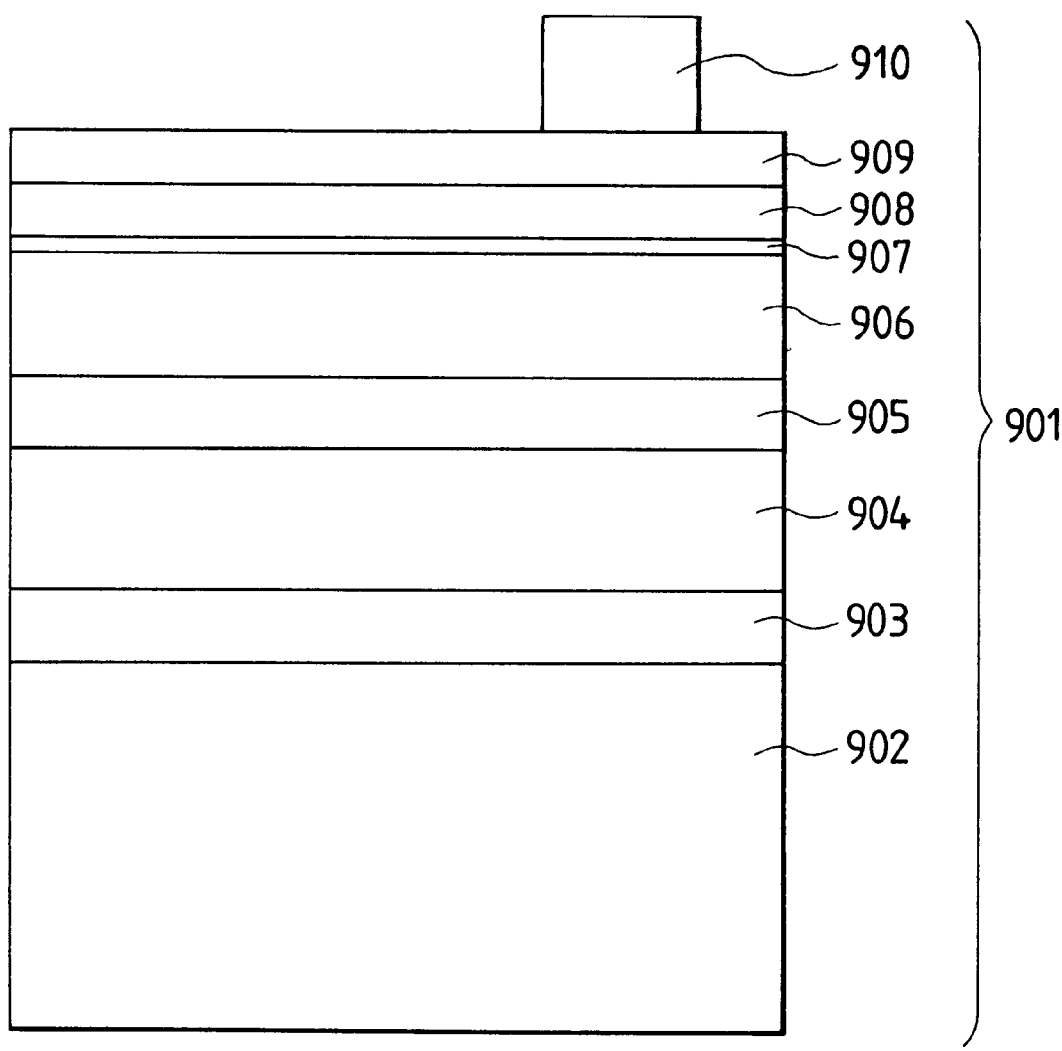
FIG. 9 shows the layer construction of a silicon single cell type photovoltaic element made by the apparatus of the present invention.

A Si single cell type photovoltaic element 1201 having a layer construction shown in FIG. 9 was made by the apparatus 101 of FIG. 1.

This photovoltaic element 901 is constructed by a back reflecting layer 903, a reflection increasing layer 904, a first electrically conductive type (n type) layer 905, a non-crystalline i type Si semiconductor layer 906, a microcrystalline i type Si semiconductor layer 907, a microcrystalline p type semiconductor layer 908, transparent electrically conductive film 909 and a current collecting electrode 910 being successively formed on an electrically conductive belt-like member (SUS 430) 902. The belt-like member 902 has a width of 40 cm and a thickness of 0.14 mm, and had the photovoltaic element made over the length 1000 m thereof.

A specific manufacturing procedure will be shown below.

First, aluminum thin film which was a back reflecting layer and ZnO thin film which was a reflection increasing layer were evaporated to 100 nm and 1 μm, respectively, as lower electrodes on a sufficiently degreased and washed belt-like member by the sputtering method.

Thereon, a semiconductor layer was formed by a similar procedure by the use of a continuously forming apparatus using the roll to roll system shown in FIG. 1.

A partition-like electrode of a shape as shown in FIG. 6 was adopted as the cathode electrode of a microcrystalline p type layer forming chamber. The nearest distance between the belt-like member and the partition-like electrodes which were a part of the cathode electrode was 0.5 cm, the spacing between adjacent ones of eighteen partition-like electrodes was 5 cm (that is, the length of the cathode electrode was 105 cm), the length of the partition-like electrodes in the widthwise direction of the belt-like member was 50 cm, and the ratio of the cathode area to the grounded whole anode area including the electrically conductive belt-like member was 3.0 times. Next, ITO (In$_2$O$_3$ +SnO$_2$) was evaporated to 80 nm as a transparent electrode on the microcrystalline p type semiconductor layer by sputtering, and Al was further deposited to 2 μm as a current collecting electrode by vacuum evaporation to thereby make a photovoltaic element (element-Embodiment 1.

The formation conditions (the material gas used, RF electric power, pressure and substrate temperature) of the semiconductor layers of the above-described photovoltaic element are shown in Table 1 below.

TABLE 1 substrate: SUS 430 BA, thickness 0.13 mm
reflecting layer: aluminum (Al) thin film 100 nm
reflection increasing layer: zinc oxide (ZnO) think film 1 μm
gate gas: 700 sccm from each gate

| names of layers | thickness of each layer | gas used and flow rate (sccm) | | RF, MW electric power (w) | | pressure Torr | substrate temperature (° C.) |
|---|---|---|---|---|---|---|---|
| non-crystalline | 40 | SiH$_4$ | 160 | RF | 200 | 1.2 | 300 |
| n type Si layer | | PH$_3$ | 4 | | | | |
| (1st electrically conductive type layer) | | H$_2$ | 2000 | | | | |
| non-crystalline | 140 | SiH$_4$ | 400 | RF | 800 | 1.5 | 200 |
| type Si layer | | H$_2$ | 2000 | | | | |
| microcrystalline i | 10 | SiH$_4$ | 10 | RF | 1000 | 1.3 | 200 |
| type Si layer | | H$_2$ | 1200 | | | | |
| microcrystalline p | 10 | SiH$_4$ | 10 | RF | 1500 | 1.2 | 200 |
| type Si layer | | BF$_3$ | 1 | | | | |
| (2nd electrically conductive type layer) | | B$_2$ | 2500 | | | | | transparent electrode: ITO (In$_2$O$_3$ + SnO$_2$) thin film 80 μm
current collecting electrode: aluminum (Al) thin film 2 μm The following comparison and studies were done to evaluate the photoelectric converting performance of the photovoltaic element made in Embodiment 1.

Comparative Example 1

For comparison, a Si single cell without a microcrystalline i type semiconductor layer was made.
(Element-A)

The making of this element-A was done in accordance with the procedure of making the element-Embodiment 1 with the exception that in the apparatus of FIG. 1, discharge was not caused in the microcrystalline i type Si semiconductor layer forming chamber 107.

Also, a photovoltaic element in which instead of the microcrystalline i type semiconductor layer of element-Embodiment 1, an equal thickness (10 nm) was added to the non-crystalline i type semiconductor layer was made.
(Element-B)

The making of this element-B was done in accordance with the procedure of making element-Embodiment 1, with the exception that in the apparatus of FIG. 1, discharge was not caused in the microcrystalline i type semiconductor layer forming chamber 107 and the non-crystalline i type Si semiconductor formed in the non-crystalline i type semiconductor layer forming chamber 106 was added by 10 nm.

The evaluation of the three kinds of photovoltaic elements made in Embodiment 1 and Comparative Example 1 was done. The current-voltage characteristic was evaluated with the central portion of the belt-like member in the widthwise direction thereof cut out from the end portion (5 cm from the end) with an area of 5 cm square, and installed under the application of AM-1.5 (100 mW/cm$^2$) light and with the photoelectric conversion efficiency measured. The result is shown in Table 2 below. Each value is an arbitrary value when each characteristic of element-Comparative Example 1 is 1.00. In the element-Embodiment 1 in which the microcrystalline i type layer was provided by the apparatus of the present invention, as compared with elements-A and B in which such layer was not provided, an improvement in the fill factor was found with a result that the conversion efficiency was improved to 1.07 times.

TABLE 2

| names of elements | conversion efficiency (%) | open voltage (V) | short-circuiting current (mA/cm$^2$) | fill factor |
|---|---|---|---|---|
| (element-Emb. 1) | 1.07 | 1 | 1.02 | 1.05 |
| (element-A) | 1 | 1 | 1 | 1 |
| (element-B) | 1 | 1 | 1.05 | 0.95 |

Comparative Example 2

The formation conditions under which the microcrystalline i type layer was formed as microcrystalline were examined.

Up to the non-crystalline i type layer were formed by a procedure similar to that in Embodiment 1, and accumulated film was formed under the formation conditions shown in Table 3 below to form a microcrystalline i type layer thereon, and a p type layer was not formed, but the accumulated film was taken out, and the crystalline property of the accumulated film was evaluated by a TEM (transmission type electronic microscope) photograph.

The formation conditions and crystalline property of the microcrystalline i type layer are shown in Table 4 below.

As a result, it was confirmed that accumulated film having a layer thickness of 5 nm or greater made under the conditions that the amount of supply of H$_2$ gas to the discharge space was 50 times as great as the amount of supply of SiH$_4$ gas or greater and the density of high frequency electric power on the electrode was 0.2 (W/cm$^2$) or greater was microcrystallized.

TABLE 3

| | formation conditions of microcrystalline i type semiconductor layer | | |
|---|---|---|---|
| H$_2$/SiH$_4$ gas flow ratio | RF electric power density (W/cm$^2$) | layer thickness (nm) | confirmation of microcrystalline property |
| 10 | 1 | 10 | x |
| 10 | 1 | 15 | x |
| 50 | 0.1 | 10 | x |
| 50 | 0.1 | 15 | x |
| 50 | 0.2 | 10 | o |
| 50 | 0.5 | 5 | o |
| 80 | 0.1 | 15 | x |
| 80 | 0.2 | 5 | o |
| 100 | 0.1 | 15 | x |
| 100 | 0.2 | 5 | o | other formation conditions pressure 1.3 Torr, substrate temperature 200° C.

Comparative Example 3

The formation conditions of the microcrystallized p type layer and the current-voltage characteristic (photoelectric conversion characteristic) of the photovoltaic element were examined as the dependency on the crystalline property of the i type layer surface in contact with the p type layer and the dependency on the p type layer formation conditions (the amount of supply of the material gas and the amount of supply of the high frequency electric power).

Up to the non-crystalline i type layer were made by a procedure similar to that in Embodiment 1, and a microcrystalline i type layer and a p type layer to be microcrystallized were formed thereon and used as a sample.

The cross-section of the sample was observed by TEM as in Comparative Example 2 and the crystalline property of the p type layer was evaluated.

Further, transparent electrically conductive film equal to that in Embodiment 1 was formed on the sample to thereby form a current collecting electrode, and the current-voltage characteristic (photoelectric conversion characteristic) of the photovoltaic element was evaluated.

The current-voltage characteristic was evaluated with the central portion of the belt-like member in the widthwise direction cut out with an area of 5 cm square from the end portion (5 cm from the end) and installed under the application of AM-1.5 (100 mW/cm$^2$) light and with the current-voltage characteristic measured.

The formation conditions of the sample and the result of the evaluation of the microcrystalline property are shown in Table 4 below.

As regards the crystalline property of the p type layer, a mark o is written in the columns of samples on which microcrystal was found, and a mark X is written in the columns of samples on which microcrystal was not found.

As regards the current-voltage characteristic of the photovoltaic element, a mark o is written in the columns of samples for which a value of 95% or more of the best numerical value was obtained, a mark Δ is written in the columns of samples for which a value of 90% or more was obtained, and a mark X is written in the columns of samples for which a value less than 90% was obtained.

It has been found from the result of the evaluation that the microcrystalline i type layer is on the non-crystalline i type layer, whereby the microcrystallization of the p type layer is expedited. That is, the microcrystalline property could be confirmed even for a small layer thickness of the order of 5 nm Å. Also, the microcrystalline property could be confirmed for the high density 50% of the doping gas BF$_3$ to the flow rate of SiH$_4$ gas, and it was good also in the current-voltage characteristic of the photovoltaic element.

TABLE 4-1

| presence or absence and layer thickness (Å) of microcrystalline i type layer | p type layer formation conditions | | | determination of microcrystalline property of p type layer | conversion efficiency | open voltage | short-circuiting current | fill factor |
|---|---|---|---|---|---|---|---|---|
| | H$_2$/SiH$_4$ flow ratio | BF$_3$/SiH$_4$ (%) | film thickness (nm) | | | | | |
| pres. 100 | 20 | 2 | 50 | X | X | X | X | X |
| pres. 100 | 20 | 2 | 100 | ○ | X | X | X | X |
| pres. 100 | 20 | 2 | 200 | ○ | X | X | X | X |
| pres. 100 | 20 | 10 | 50 | X | X | X | X | X |
| pres. 100 | 20 | 10 | 100 | X | X | X | X | X |
| pres. 100 | 20 | 10 | 150 | X | X | X | X | X |
| pres. 100 | 20 | 10 | 200 | ○ | X | X | X | X |
| pres. 100 | 20 | 20 | 50 | X | X | X | X | X |
| pres. 100 | 20 | 20 | 100 | X | X | X | X | X |
| pres. 100 | 20 | 20 | 150 | X | X | X | X | X |
| pres. 100 | 20 | 20 | 200 | X | X | X | X | X |
| pres. 100 | 20 | 50 | 50 | X | X | X | X | X |
| pres. 100 | 20 | 50 | 100 | X | X | X | X | X |
| pres. 100 | 20 | 50 | 150 | X | X | X | X | X |
| pres. 100 | 20 | 50 | 200 | X | X | X | X | X |
| pres. 100 | 20 | 80 | 50 | X | X | X | X | X |
| pres. 100 | 20 | 80 | 100 | X | X | X | X | X |
| pres. 100 | 20 | 80 | 150 | X | X | X | X | X |
| pres. 100 | 20 | 80 | 200 | X | X | X | X | X |

TABLE 4-2

| presence or absence and layer thickness (Å) of microcrystalline i type layer | p type layer formation conditions | | | determination of microcrystalline property of p type layer | conversion efficiency | open voltage | short-circuiting current | fill factor |
|---|---|---|---|---|---|---|---|---|
| | H$_2$/SiH$_4$ flow ratio | BF$_3$/SiH$_4$ (%) | film thickness (nm) | | | | | |
| pres. 100 | 50 | 2 | 50 | X | X | X | X | X |
| pres. 100 | 50 | 2 | 100 | ○ | X | X | X | X |
| pres. 100 | 50 | 2 | 200 | ○ | X | X | X | X |
| pres. 100 | 50 | 5 | 50 | X | X | X | Δ | Δ |
| pres. 100 | 50 | 5 | 100 | ○ | ○ | ○ | ○ | ○ |
| pres. 100 | 50 | 5 | 200 | ○ | X | X | X | X |
| pres. 100 | 50 | 10 | 50 | X | X | Δ | Δ | Δ |
| pres. 100 | 50 | 10 | 100 | ○ | ○ | ○ | ○ | ○ |
| pres. 100 | 50 | 10 | 150 | ○ | ○ | ○ | ○ | ○ |
| pres. 100 | 50 | 10 | 200 | ○ | X | X | X | X |
| pres. 100 | 50 | 20 | 50 | X | Δ | ○ | Δ | Δ |
| pres. 100 | 50 | 20 | 100 | ○ | ○ | ○ | ○ | ○ |
| pres. 100 | 50 | 20 | 150 | ○ | ○ | ○ | ○ | ○ |
| pres. 100 | 50 | 20 | 200 | ○ | X | X | X | X |
| pres. 100 | 50 | 50 | 50 | X | Δ | ○ | Δ | Δ |
| pres. 100 | 50 | 50 | 100 | ○ | ○ | ○ | ○ | ○ |
| pres. 100 | 50 | 50 | 150 | ○ | ○ | ○ | ○ | ○ |
| pres. 100 | 50 | 50 | 200 | ○ | X | X | X | X |
| pres. 100 | 50 | 80 | 50 | X | X | X | X | X |
| pres. 100 | 50 | 80 | 100 | X | X | X | X | X |
| pres. 100 | 50 | 80 | 150 | X | X | X | X | X |
| pres. 100 | 50 | 80 | 200 | X | X | X | X | X |

TABLE 4-3

| presence or absence and layer thickness (Å) of microcrystalline i type layer | p type layer formation conditions | | | determination of microcrystalline property of p type layer | conversion efficiency | open voltage | short-circuiting current | fill factor |
|---|---|---|---|---|---|---|---|---|
| | H$_2$/SiH$_4$ flow ratio | BF$_3$/SiH$_4$ (%) | film thickness (nm) | | | | | |
| pres. 100 | 100 | 2 | 50 | X | X | X | X | X |
| pres. 100 | 100 | 2 | 100 | ○ | X | X | X | Δ |
| pres. 100 | 100 | 2 | 200 | ○ | X | X | X | X |

TABLE 4-3-continued

| presence or absence and layer thickness (Å) of microcrystalline i type layer | p type layer formation conditions | | | determination of microcrystalline property of p type layer | conversion efficiency | open voltage | short-circuiting current | fill factor |
|---|---|---|---|---|---|---|---|---|
| | H₂/SiH₄ flow ratio | BF₃/SiH₄ (%) | film thickness (nm) | | | | | |
| pres. 100 | 100 | 5 | 50 | ○ | X | X | Δ | Δ |
| pres. 100 | 100 | 5 | 100 | ○ | ○ | ○ | ○ | ○ |
| pres. 100 | 100 | 5 | 150 | ○ | ○ | ○ | ○ | ○ |
| pres. 100 | 100 | 5 | 200 | ○ | X | Δ | X | Δ |
| pres. 100 | 100 | 10 | 50 | ○ | X | Δ | Δ | Δ |
| pres. 100 | 100 | 10 | 100 | ○ | ○ | ○ | ○ | ○ |
| pres. 100 | 100 | 10 | 150 | ○ | ○ | ○ | ○ | ○ |
| pres. 100 | 100 | 10 | 200 | ○ | Δ | ○ | Δ | Δ |
| pres. 100 | 100 | 20 | 50 | ○ | Δ | Δ | ○ | Δ |
| pres. 100 | 100 | 20 | 100 | ○ | ○ | ○ | ○ | ○ |
| pres. 100 | 100 | 20 | 150 | ○ | ○ | ○ | ○ | ○ |
| pres. 100 | 100 | 20 | 200 | ○ | Δ | ○ | Δ | Δ |
| pres. 100 | 100 | 50 | 50 | ○ | Δ | Δ | ○ | ○ |
| pres. 100 | 100 | 50 | 100 | ○ | ○ | ○ | ○ | ○ |
| pres. 100 | 100 | 50 | 150 | ○ | ○ | ○ | ○ | ○ |
| pres. 100 | 100 | 50 | 200 | ○ | X | Δ | X | Δ |
| pres. 100 | 100 | 80 | 50 | X | X | X | X | X |
| pres. 100 | 100 | 80 | 100 | X | X | X | X | X |
| pres. 100 | 100 | 80 | 150 | X | X | X | X | X |
| pres. 100 | 100 | 80 | 200 | X | X | X | X | X |

Other formation conditions of the p type layer RF electric power 0.02 W/CM³, self-bias of the cathode electrode +100 to +150 Pressure 1.2 Torr substrate temperature 200° C.

Comparative Example 4

The crystallinity of the microcrystalline i type layer was changed in the direction of layer thickness in several patterns. A case where the crystallinity was to be increased toward the p type layer and a case where the crystallinity was to be decreased toward the p type layer were set, and the voltage-current characteristics of photovoltaic elements made were compared with each other.

When the crystallinity was to be increased toward the p type layer, the material gas was introduced from the upper part in the direction of conveyance of the belt-like member, and was made to flow toward the lower part. When the crystallinity was to be decreased toward the p type layer, the material gas was introduced from the lower part in the direction of conveyance of the belt-like member, and was made to flow toward the upper part.

The current-voltage characteristics of the photovoltaic elements made are shown in Table 5 below.

When the material gas was introduced from the upper part in the direction of conveyance of the belt-like member, and was made to flow toward the lower part and the crystalline property of the accumulated film was improved toward the p type layer, the performance of the photovoltaic element was higher in FF.

Comparative Example 5

The following comparison and studies were done to evaluate the photoelectric converting performance of the photovoltaic element made in Embodiment 1.

The thicknesses of the microcrystalline i type layer and the microcrystalline p type semiconductor layer and the density of the p type impurity were variously changed by a procedure similar to that in Embodiment 1 to thereby make a photoelectromotive power element.

A microcrystalline p type layer was formed on a non-crystalline i type layer to thereby provide a photovoltaic element, and the density of the p type impurity thereof was changed, whereby the current-voltage characteristics of the photovoltaic elements made in Embodiment 1 and Comparative Example 5 were evaluated.

TABLE 5

| direction of flow of material gas | crystallinity of i type layer | crystallinity of p type layer acummulated thereon | current-voltage characteristics of elements | | | |
|---|---|---|---|---|---|---|
| | | | Voc | Jsc | FF | η |
| from upper part to lower part in the direction of conveyance of belt-like member | crystallinity is high on the p type layer side | high crystallinity | high | same | high | high |
| from lower part to upper part in the direction of conveyance of belt-like member | crystallinity is low on the p type layer side | somewhat low crystallinity | low | same | low | low |

The current-voltage characteristic was evaluated with the central portion of the belt-like member in the widthwise direction thereof cut out from the end portion (5 cm from the end) with an area of 5 cm square, and installed under the application of AM-1.5 (100 mW/cm$^2$) light and with the photoelectric conversion efficiency, etc. measured. The result is shown in Table 6 below.

Each value is an arbitrary value when each characteristic of Embodiment 1 is 1.00.

In the table, as regards the values of the conversion efficiency, open voltage, short-circuiting current and fill factor, the highest value is 1 and when the performance is recognized as substantially equal performance at a value of 95% or more relative to the highest value, a mark ○ is written, and when the performance is somewhat inferior at 90% to less than 95%, a mark Δ is written, and when the performance is considerably inferior at less than 90%, a mark X is written.

Also, the density of the impurity (the analysis of composition) in the accumulated film was decided by a secondary ion mass analysis (SIMS).

p type layer was 10$^{21}$ atoms/cm$^3$ or less, a reduction in the open voltage was found.

There were made three kinds of distributions of the density of the p type impurity in the microcrystalline p type layer in the direction of layer thickness, i.e., a distribution which was uniform in the direction of layer thickness (comparative element 1-2A), a distribution in which the outermost surface of the p type layer was dense and became thin toward the i type layer (comparative element 1-2B) and a distribution in which the outermost surface of the p type layer was thin and became dense toward the i type layer (comparative element 1-2C).

As in the case of Comparative Example 5, the current-voltage characteristic of the element made was measured and evaluated.

TABLE 6

| names of elements | thickness of microcrystalline p type layer (nm) | density of p layer layer impurity | conversion efficiency (%) | open voltage (v) | Short-circuiting current (mA/cm$^2$) | fill factor |
|---|---|---|---|---|---|---|
| comp. element 1-1A | 50 | 10$^{19}$ | X | X | X | X |
| comp. element 1-1B | 50 | 10$^{20}$ | X | X | X | X |
| comp. element 1-1C | 50 | 10$^{21}$ | X | X | X | X |
| comp. element 1-1D | 50 | 10$^{22}$ | X | X | X | X |
| comp. element 1-1E | 50 | 10$^{23}$ | X | Δ | X | X |
| comp. element 1-1F | 100 | 10$^{19}$ | X | X | X | Δ |
| comp. element 1-1G | 100 | 10$^{20}$ | X | Δ | Δ | ○ |
| comp. element 1-1H | 100 | 10$^{21}$ | 1 | ○ | 1 | 1 |
| comp. element 1-1I | 100 | 10$^{22}$ | ○ | 1 | ○ | ○ |
| comp. element 1-1J | 100 | 10$^{23}$ | Δ | ○ | Δ | Δ |
| comp. element 1-1K | 150 | 10$^{19}$ | X | X | Δ | Δ |
| comp. element 1-1L | 150 | 10$^{20}$ | X | Δ | Δ | Δ |
| comp. element 1-1M | 150 | 10$^{21}$ | ○ | ○ | Δ | ○ |
| comp. element 1-1N | 150 | 10$^{22}$ | Δ | ○ | Δ | Δ |
| comp. element 1-1O | 200 | 10$^{19}$ | X | X | X | X |
| comp. element 1-1P | 200 | 10$^{20}$ | X | Δ | X | X |
| comp. element 1-1Q | 200 | 10$^{21}$ | X | Δ | Δ | Δ |
| comp. element 1-1R | 200 | 10$^{22}$ | X | Δ | X | X |

The result is shown in Table 7 below.

TABLE 7

| names of elements | thickness of microcrystalline p type layer (nm) | density of p type layer impurity max atoms/cm$^3$ | distribution of density of p type layer impurity in the direction of layer thickness | conversion efficiency (%) | open voltage (v) | short-circuiting current (mA/cm$^2$) | fill factor |
|---|---|---|---|---|---|---|---|
| comp. element 1-2A | 100 | 10$^{21}$ | uniform | 1 | 1 | 1 | 1 |
| comp. element 1-2B | 100 | 10$^{21}$ | dense on the surface and less toward i layer | 1.05 | 1.02 | 1 | 1.03 |
| comp. element 1-2C | 100 | 10$^{21}$ | thin on the surface and more toward i layer | 0.43 | 0.85 | 0.85 | 0.6 |

From Table 6, it is seen that when the thickness of the microcrystalline p type layer became as great as about 200 Å, a reduction in the fill factor was found and that when the maximum value of the density of the p type impurity in the As regards the current-voltage characteristic of the element, high conversion efficiency was obtained in an element having a density distribution in which the density of the p type layer impurity decreased toward the i layer.

Comparative Example 7

A photovoltaic element equal to that of Embodiment 1 with the exception that the layer thickness of a non-crystalline i type layer was interposed between a non-crystalline i type layer and a microcrystalline p type layer and the layer thicknesses of the microcrystalline i type layer and the p type microcrystalline layer were changed was made by a procedure similar to that in Embodiment 1.

The density of the p type impurity in the microcrystalline p type layer was of the order of $10^{21}$ atoms/cm$^3$ and had a distribution in which the density decreased toward the i layer side.

As in the case of Comparative Example 5, the current-voltage characteristic of the element made was measured and evaluated. The result is shown in Table 8 below.

In the table, when the values of conversion efficiency, open voltage, short-circuiting current and fill factor are 95% relative to those in the embodiment and the performance is found to be substantially equal to that of the embodiment, a mark ○ is written, and when said values are 90% to less than 95% and the performance is somewhat inferior, a mark Δ is written, and when said values are less than 90% and the performance is considerably inferior, a mark X is written.

structed by laminating a back reflecting surface 1003, a reflection increasing layer 1004, a non-crystal n type Si semiconductor layer 1005 which is a first electrically conductive type layer, a non-crystalline i type Si semiconductor layer 1006, a non-crystalline i type SiGe semiconductor layer 1007, a non-crystalline i type Si semiconductor layer 1008, a microcrystalline i type Si semiconductor layer 1009, a microcrystalline p type Si semiconductor layer 1010 which is a second electrically conductive type layer, transparent electrically conductive film 1011 and a current collecting electrode 1012 on an electrically conductive belt-like member (SUS 430) 1002.

For the formation of the semiconductor layers, use was made of a single cell continuously forming apparatus having an accumulated film forming chamber corresponding to each semiconductor layer and using the roll to roll system shown in FIG. 2.

In FIG. 2, the reference numeral 201 generally designates an accumulated film forming apparatus. The reference numeral 203 denotes a pay-away chamber for a long belt-like member 202, the reference numeral 204 designates a take-up chamber for the belt-like member 202, and the reference numerals 205, 206, 207, 208, 209 and 210 denote accumulated film forming chambers. The reference numeral 205 designates a chamber for forming a non-crystalline n

TABLE 8

| name of elements | layer thickness of microcrystalline i type layer (nm) | layer thickness of microcrystalline p type layer (nm) | conversion efficiency (%) | open voltage (v) | Short-circuiting current (mA/cm$^2$) | fill factor |
| --- | --- | --- | --- | --- | --- | --- |
| comp. element 1-3A | 0 | 100 | X | Δ | Δ | Δ |
| comp. element 1-3B | 0 | 150 | X | Δ | Δ | Δ |
| comp. element 1-3C | 0 | 200 | X | Δ | Δ | Δ |
| comp. element 1-3D | 30 | 100 | X | Δ | Δ | Δ |
| comp. element 1-3E | 30 | 150 | X | Δ | Δ | Δ |
| comp. element 1-3F | 30 | 200 | X | Δ | Δ | Δ |
| comp. element 1-3G | 50 | 100 | ○ | ○ | ○ | ○ |
| comp. element 1-3H | 50 | 150 | ○ | ○ | ○ | ○ |
| comp. element 1-3I | 50 | 200 | Δ | ○ | Δ | Δ |
| comp. element 1-3J | 100 | 50 | X | Δ | Δ | Δ |
| embodiment 1 | 100 | 100 | 1 | 1 | 1 | 1 |
| comp. element 1-3K | 100 | 150 | ○ | ○ | ○ | ○ |
| comp. element 1-3L | 100 | 200 | X | Δ | X | X |
| comp. element 1-3M | 150 | 100 | X | Δ | Δ | X |
| comp. element 1-3N | 150 | 150 | X | Δ | Δ | X |
| comp. element 1-3O | 150 | 200 | X | Δ | X | X |
| comp. element 1-3P | 200 | 100 | X | X | X | X |
| comp. element 1-3Q | 200 | 150 | X | X | X | X |
| comp. element 1-3R | 200 | 200 | X | X | X | X |

As regards the current-voltage characteristic such as conversion efficiency, high photoelectric conversion efficiency was obtained in a photovoltaic element in which the layer thickness of the microcrystalline i type layer was 50–100 Å and the layer thickness of the microcrystalline p type semiconductor layer was 100–150 Å (from a detailed experiment, 80–150 Å was found to be suitable).

From Embodiment 1 and Comparative Examples 5, 6 and 7, the excellence of the photoelectric conversion characteristic of the Si single cell type photovoltaic element made on the basis of the present invention is shown.

Embodiment 2

Figure 10:
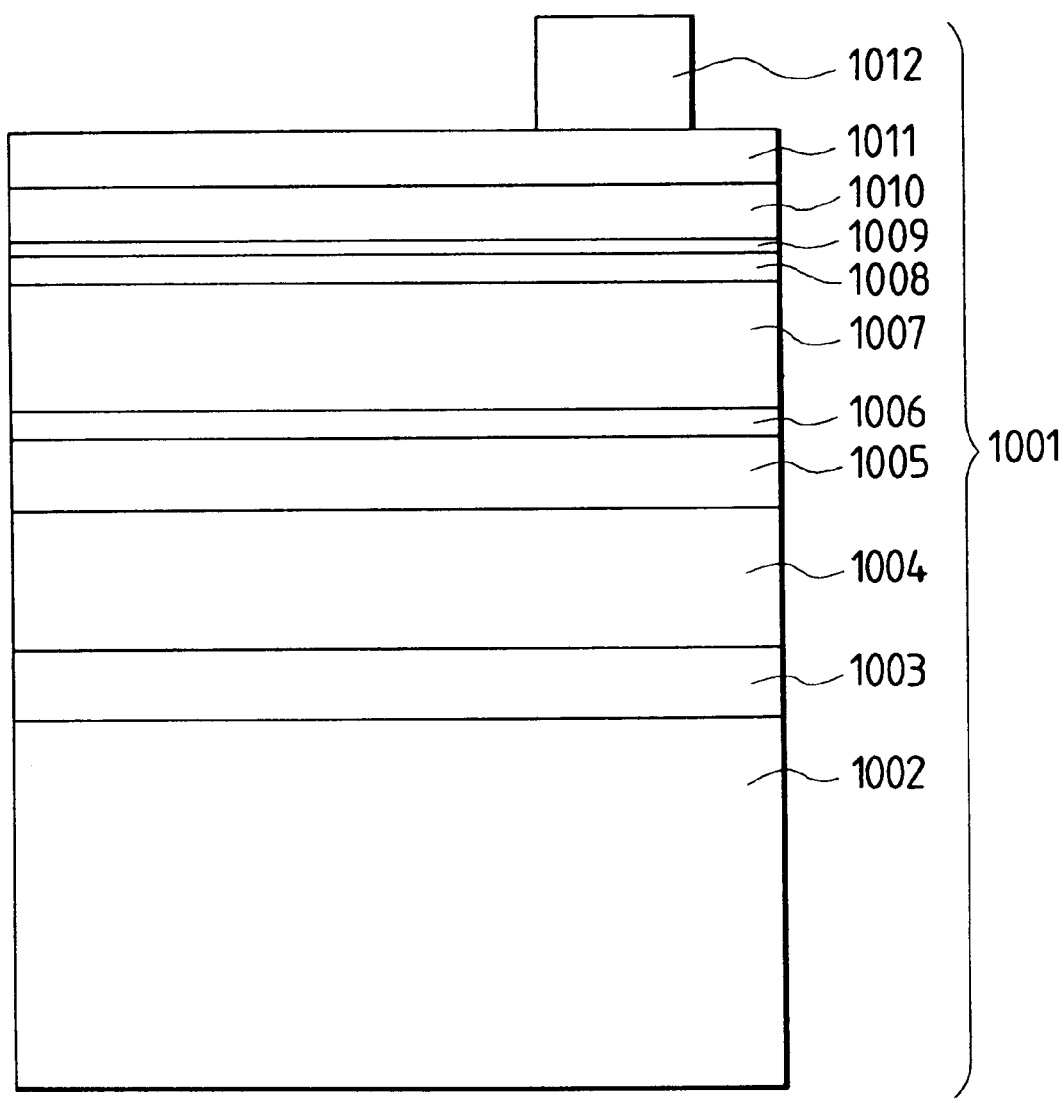
FIG. 10 shows the layer construction of a silicon germanium single cell type photovoltaic element made by the apparatus of the present invention.

On the basis of the present invention, a SiGe single cell type photovoltaic element having a layer construction shown in FIG. 10 was made under the conditions of Table 6 by a procedure similar to that in Embodiment 1. (Element-Embodiment 2). This photovoltaic element 1001 is contype Si semiconductor layer as the first electrically conductive type layer, the reference numeral 206 denotes a chamber for forming the non-crystalline i type Si semiconductor layer, the reference numeral 207 designates a chamber for forming the non-crystalline i type SiGe semiconductor layer, the reference numeral 208 denotes a chamber for forming the non-crystalline i type Si semiconductor layer, the reference numeral 209 designates a chamber for forming the microcrystalline i type Si semiconductor layer, and the reference numeral 210 denotes a chamber for forming the microcrystalline p type Si semiconductor layer. The reference numeral 212 designates a discharge space. The reference numeral 211 denotes a gas gate, and the reference numerals 213 and 214 designate bobbins. The chambers for forming the respective semiconductor layers are connected together through the gas gate and the independence of the discharge space is maintained.

Figure 7:
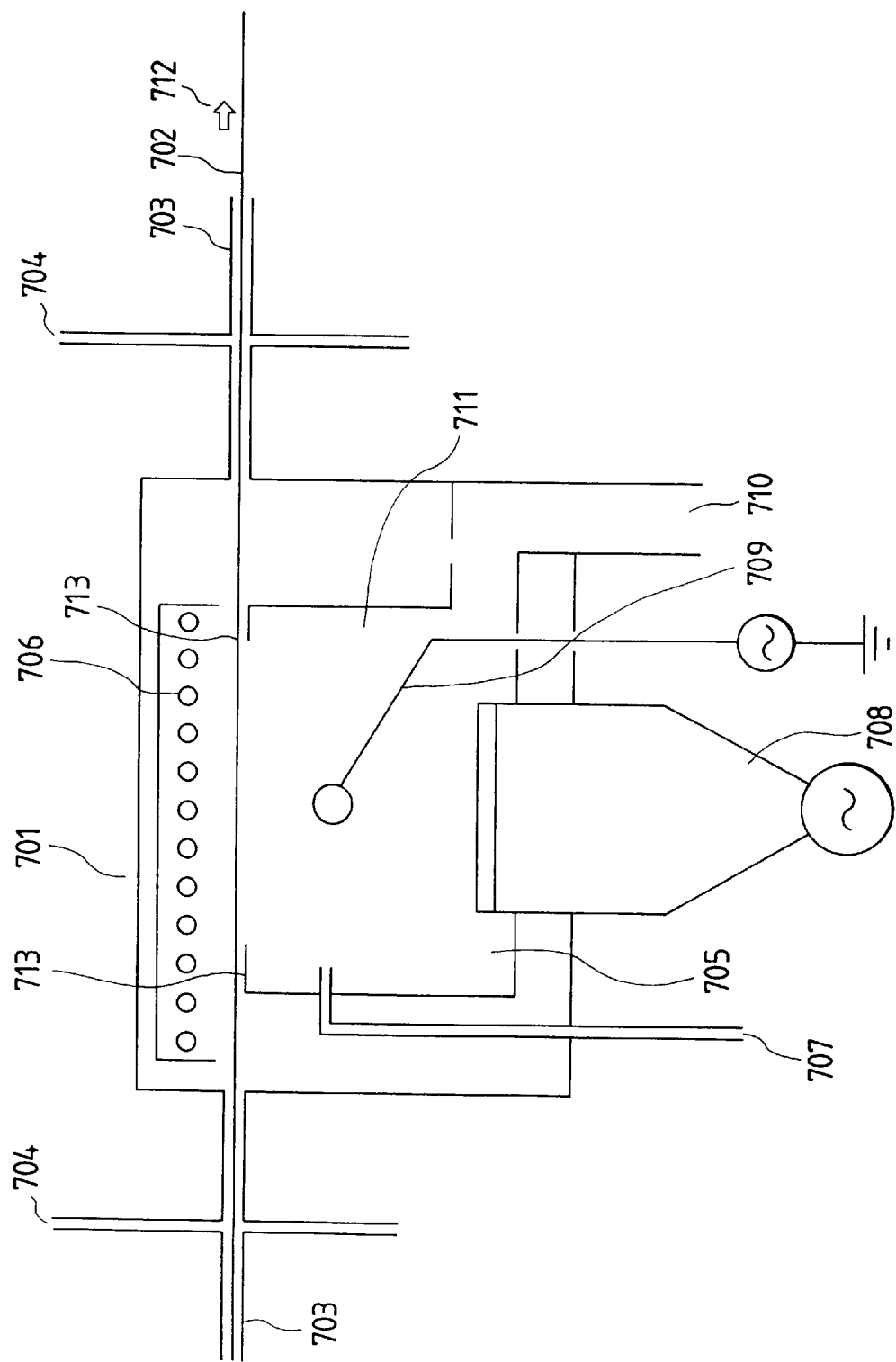
FIG. 7 shows a microwave non-crystalline i type SiGe semiconductor layer forming chamber used in the present invention.
Figure 8:
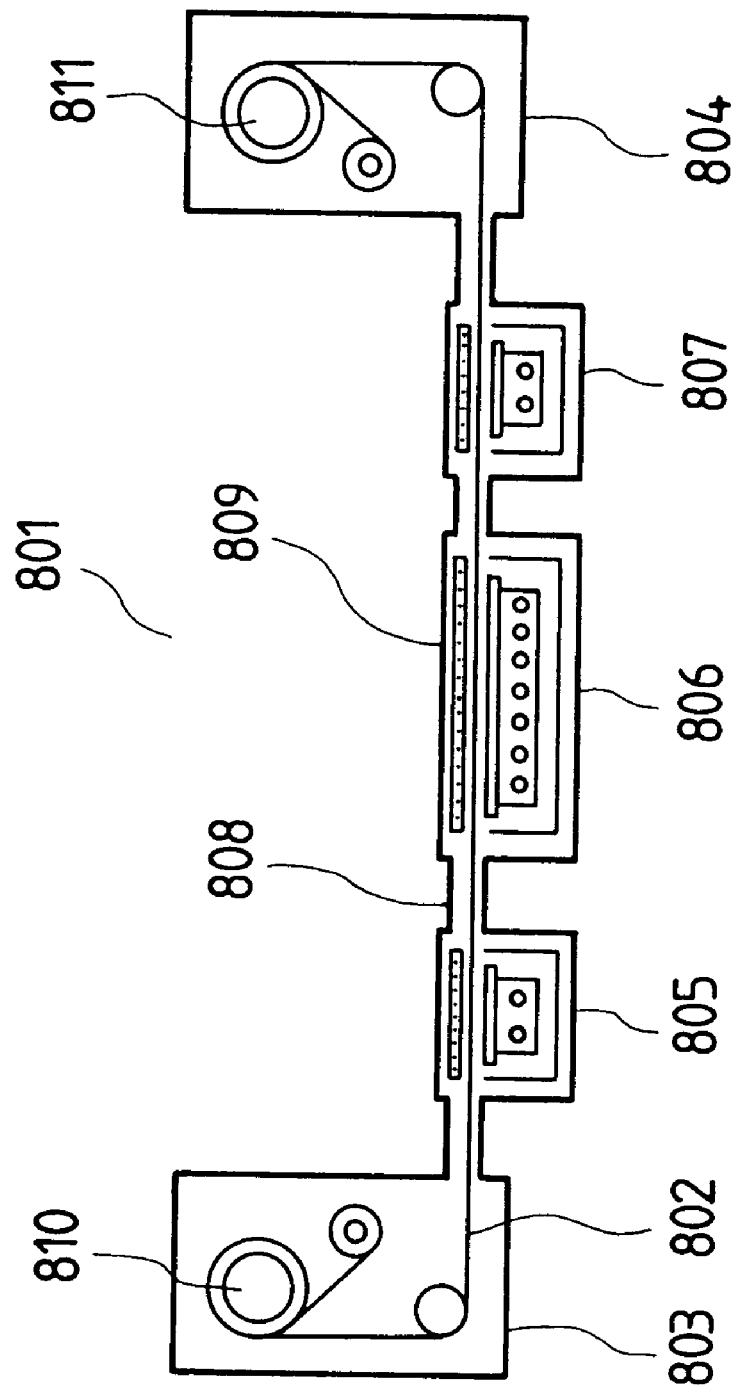
FIG. 8 shows an apparatus for forming a single cell type photovoltaic element by a typical roll to roll system.

FIG. 7 is a structural cross-sectional view of the non-crystalline i type SiGe semiconductor layer forming chamber 207, and more particularly an accumulated film forming chamber using the microwave plasma CVD method.

Next, in FIG. 7, the reference numeral 701 designates an accumulated film forming chamber, the reference numeral 702 denotes a belt-like member, the reference numeral 703 designates a gas gate, the reference numeral 704 denotes gate gas introducing means, the reference numeral 705 designates a discharge furnace, the reference numeral 706 denotes belt-like member heating means (a lamp heater), the reference numeral 707 designates material gas supply means, the reference numeral 708 denotes microwave introducing means, the reference numeral 709 designates high frequency introducing means, the reference numeral 710 denotes exhaust means, and the reference numeral 711 designates a discharge area. The arrow 712 indicates the direction of movement of the belt-like member, and the reference numeral 713 denotes film formation area adjusting means.

Description will now be made of the procedure of forming a non-crystalline i type SiGe semiconductor layer by the non-crystalline i type SiGe semiconductor layer forming chamber.

First, the accumulated film forming chamber 701 in which the belt-like member 702 is extended exhausts to reduced pressure by the exhaust means 710. Next, material gas controlled to a predetermined amount of supply is introduced into the discharge space 711 by the material gas introducing means 707, and the pressure in the discharge furnace is kept constant by pressure regulating means (not shown). The belt-like member 702 and the discharge furnace 705 are controlled to predetermined temperatures by the belt-like heating means 706 and the material gas and discharge furnace member heating means. Subsequently, a microwave and high frequency electric power are applied to thereby cause discharge and decompose the material gas, and non-crystalline i type SiGe is formed on the belt-like member 702 while the belt-like member 702 is moved at a predetermined speed.

element (element-D) in which the thickness of a microcrystalline i type layer was replaced by a non-crystalline i type layer were made by a procedure equal to that in Embodiment 2. The evaluation of the photovoltaic elements made in Embodiment 1 and Comparative Examples 1 and 2 was done.

The current-voltage characteristic was evaluated with the central portion of the belt-like member in the widthwise direction thereof cut out from the end portion (5 cm from the end) with an area of 5 cm square, and installed under the application of AM-1.5 (100 mW/cm$^2$) light and with photoelectric conversion efficiency measured.

Comparative Example 9

For comparison, a Si single cell without a microcrystalline i type semiconductor layer was made (element-C).

The making of this element-C was done in accordance with the procedure of making element-Embodiment 2 with the exception that in the apparatus of FIG. 1, discharge was not caused in the microcrystalline i type Si semiconductor layer forming chamber 107.

Also, a photovoltaic element in which instead of the microcrystalline i type semiconductor layer of element-Embodiment 1, an equal thickness (10 nm) was added to the non-crystalline i type Si semiconductor layer was made (element-D).

The making of this element-D was done in accordance with the procedure of making element-Embodiment 2 with the exception that in the apparatus of FIG. 1, a non-crystalline i type Si semiconductor layer was added by 10 nm in the microcrystalline i type semiconductor layer forming chamber 107.

The above-described three kinds of photovoltaic elements were evaluated.

The current-voltage characteristic was evaluated with the central portion of the belt-like member in the widthwise direction thereof cut out from the end portion (5 cm from the

TABLE 9 substrate: SUS 430 BA, thickness 0.13 mm
reflecting layer: aluminum (Al) thin film 100 nm
reflection increasing layer: zinc oxide (ZnO) think film 1 μm
gate gas: 700 sccm from each gate

| names of layers | thickness of each layer (nm) | gas used and flow rate (sccm) | | RF, MW electric power (w) | | pressure Torr | substrate temperature (° C.) |
|---|---|---|---|---|---|---|---|
| non-crsptalline | 40 | SiH$_4$ | 250 | RF | 500 | 1.2 | 350 |
| n type Si layer | | pH$_3$ | 20 | | | | |
| (1st electrically conductive type layer) | | K$_2$ | 1000 | | | | |
| non-crystalline | 15 | SiH$_4$ | 75 | RF | 200 | 1.3 | 320 |
| i type Si layer | | H$_2$ | 1500 | | | | |
| non-crystalline | 120 | SiH$_4$ | 100 | MH | 500 | 0.01 | 320 |
| i type Si Ge layer | | GeH$_4$ | 140 | RF | 2000 | | |
| | | H$_2$ | 750 | | | | |
| non-crystalline | 10 | SiH$_4$ | 40 | RF | 300 | 1.3 | 320 |
| i type Si layer | | H$_2$ | 2600 | | | | |
| microcrystalline | 10 | SiH$_4$ | 25 | RF | 1000 | 1.3 | 300 |
| i type Si layer | | H$_2$ | 2500 | | | | |
| microcrystalline | 10 | SiH$_4$ | 10 | RF | 2000 | 1.2 | 250 |
| p type Si layer | | BF$_3$ | 1 | | | | |
| (2nd electrically conductive type layer) | | H$_2$ | 2500 | | | | | transparent electrode: ITO (In$_2$O$_3$ + SnO$_2$) thin film 80 nm
current collecting electrode: aluminum (Al) thin film 2 μm Comparative Example 8

A photovoltaic element (element-C) in which a microcrystalline i type layer was not interposed and a photovoltaic end) with an area of 5 cm square and installed under the application of AM-1.5 (100 mW/cm$^2$) light and with photoelectric conversion efficiency measured.

The result is shown in Table 10 below.

Each value is an arbitrary value when each characteristic of element-Comparative Example 1 is 1.00. In element-Embodiment 2 provided with a microcrystalline i type layer by the apparatus of the present invention, as compared with elements-C and D not provided with such layer, an improvement in fill factor was found with a result that conversion efficiency was improved to 1.07 times

TABLE 10

| names of elements | conversion efficiency (%) | open voltage (V) | short-circuiting current (mA/cm$^2$) | fill factor |
|---|---|---|---|---|
| (element-Emb. 2) | 1.07 | 1 | 1.02 | 1.05 |
| (element-C) | 1 | 1 | 1 | 1 |
| (element-D) | 1 | 1 | 1.05 | 0.95 |

Comparative Example 10

The formation conditions of the microcrystallized p type layer and the current-voltage characteristic (photoelectric conversion characteristic) of the photovoltaic element were examined as the dependency of the surface of the i type layer in contact with the p type layer on the crystalline property and the dependency on the p type layer formation conditions (the amount of supply of the material gas and the amount of supply of high frequency electric power).

Up to the non-crystalline i type layer were made by a procedure similar to that in Embodiment 2, and a microcrystalline i type layer and a p type layer to be microcrystallized were formed thereon to thereby provide a sample.

The cross-section of the sample was observed by means of a TEM as in Comparative Example 2 and the crystalline property of the p type layer was evaluated.

Further, transparent electrically conductive film equal to that in Embodiment 1 was formed on the sample to thereby form a current collecting electrode, and the current-voltage characteristic (photoelectric conversion characteristic) of the photovoltaic element was evaluated.

The current-voltage characteristic was evaluated with the central portion of the belt-like member in the widthwise direction thereof cut out from the end portion (5 cm from the end) with an area of 5 cm square, and installed under the application of AM-1.5 (100 mW/cm$^2$) light and with the current-voltage characteristic measured.

The result of the evaluation of the formation conditions and microcrystalline property of the sample is shown in Table 11 below.

As regards the crystalline property of the p type layer, a mark ○ is written in the column of a sample in which microcrystal was found, and a mark X is written in the column of a sample in which microcrystal was not found.

As regards the current-voltage characteristic of the photovoltaic element, a mark ○ is written in the column of a sample in which 95% or more of the best numerical value was obtained, a mark Δ is written in the column of a sample in which 90% or more of the best numerical value was obtained, and a mark X is written in the column of a sample in which less than 90% of the best numerical value was obtained. From the result of the evaluation, it has been found that a microcrystalline i type layer intervenes on the non-crystalline i type layer, whereby the microcrystallization of the p type layer is expedited. That is, the microcrystalline property could be confirmed even for a small layer thickness of the order of 5 nm. Also, the microcrystalline property could be confirmed even for the high density of doping gas BF$_3$ amounting to 50% for the flow rate of SiH$_4$ gas, and was good also in the current-voltage characteristic of the photovoltaic element.

TABLE 11-1

| presence or absence and layer thickness (Å) of microcrystalline i type layer | p type layer formation conditions | | | determination of microcrystalline property of p type layer | conversion efficiency | open voltage | short-circuiting current | fill factor |
|---|---|---|---|---|---|---|---|---|
| | H$_2$/SiH$_4$ flow ratio | BF$_3$/SiH$_4$ (%) | film thickness (nm) | | | | | |
| pres. 100 | 20 | 2 | 50 | X | X | X | X | X |
| pres. 100 | 20 | 2 | 100 | ○ | X | X | X | X |
| pres. 100 | 20 | 2 | 200 | ○ | X | X | X | X |
| pres. 100 | 20 | 10 | 50 | X | X | X | X | X |
| pres. 100 | 20 | 10 | 100 | X | X | X | X | X |
| pres. 100 | 20 | 10 | 150 | X | X | X | X | X |
| pres. 100 | 20 | 10 | 200 | ○ | X | X | X | X |
| pres. 100 | 20 | 20 | 50 | X | X | X | X | X |
| pres. 100 | 20 | 20 | 100 | X | X | X | X | X |
| pres. 100 | 20 | 20 | 150 | X | X | X | X | X |
| pres. 100 | 20 | 20 | 200 | X | X | X | X | X |
| pres. 100 | 20 | 50 | 50 | X | X | X | X | X |
| pres. 100 | 20 | 50 | 100 | X | X | X | X | X |
| pres. 100 | 20 | 50 | 150 | X | X | X | X | X |
| pres. 100 | 20 | 50 | 200 | X | X | X | X | X |
| pres. 100 | 20 | 80 | 50 | X | X | X | X | X |
| pres. 100 | 20 | 80 | 100 | X | X | X | X | X |
| pres. 100 | 20 | 80 | 150 | X | X | X | X | X |
| pres. 100 | 20 | 80 | 200 | X | X | X | X | X |

TABLE 11-2

| presence or absence and layer thickness (Å) of microcrystalline i type layer | p type layer formation conditions | | | determination of microcrystalline property of p type layer | conversion efficiency | open voltage | short-circuiting current | fill factor |
|---|---|---|---|---|---|---|---|---|
| | $H_2/SiH_4$ flow ratio | $BF_3/SiH_4$ (%) | layer thickness (nm) | | | | | |
| pres. 100 | 50 | 2 | 50 | X | X | X | X | X |
| pres. 100 | 50 | 2 | 100 | ○ | X | X | X | X |
| pres. 100 | 50 | 2 | 200 | ○ | X | X | X | X |
| pres. 100 | 50 | 5 | 50 | X | X | X | △ | △ |
| pres. 100 | 50 | 5 | 100 | ○ | ○ | ○ | ○ | ○ |
| pres. 100 | 50 | 5 | 200 | ○ | X | X | X | X |
| pres. 100 | 50 | 10 | 50 | X | X | △ | △ | △ |
| pres. 100 | 50 | 10 | 100 | ○ | ○ | ○ | ○ | ○ |
| pres. 100 | 50 | 10 | 150 | ○ | ○ | ○ | ○ | ○ |
| pres. 100 | 50 | 10 | 200 | ○ | X | X | X | X |
| pres. 100 | 50 | 20 | 50 | X | △ | ○ | △ | △ |
| pres. 100 | 50 | 20 | 100 | ○ | ○ | ○ | ○ | ○ |
| pres. 100 | 50 | 20 | 150 | ○ | ○ | ○ | ○ | ○ |
| pres. 100 | 50 | 20 | 200 | ○ | X | X | X | X |
| pres. 100 | 50 | 50 | 50 | X | △ | ○ | △ | △ |
| pres. 100 | 50 | 50 | 100 | ○ | ○ | ○ | ○ | ○ |
| pres. 100 | 50 | 50 | 150 | ○ | ○ | ○ | ○ | ○ |
| pres. 100 | 50 | 50 | 200 | ○ | X | X | X | X |
| pres. 100 | 50 | 80 | 50 | X | X | X | X | X |
| pres. 100 | 50 | 80 | 100 | X | X | X | X | X |
| pres. 100 | 50 | 80 | 150 | X | X | X | X | X |
| pres. 100 | 50 | 80 | 200 | X | X | X | X | X |

TABLE 11-3

| presence or absence and layer thickness (Å) of microcrystalline i type layer | p type layer formation conditions | | | determination of microcrystalline property of p type layer | conversion efficiency | open voltage | short-circuiting current | fill factor |
|---|---|---|---|---|---|---|---|---|
| | $H_2/SiH_4$ flow ratio | $BF_3/SiH_4$ (%) | layer thickness (nm) | | | | | |
| pres. 100 | 100 | 2 | 50 | X | X | X | X | X |
| pres. 100 | 100 | 2 | 100 | ○ | X | X | X | △ |
| pres. 100 | 100 | 2 | 200 | ○ | X | X | X | X |
| pres. 100 | 100 | 5 | 50 | ○ | X | X | △ | △ |
| pres. 100 | 100 | 5 | 100 | ○ | ○ | ○ | ○ | ○ |
| pres. 100 | 100 | 5 | 150 | ○ | ○ | ○ | ○ | ○ |
| pres. 100 | 100 | 5 | 200 | ○ | X | △ | X | △ |
| pres. 100 | 100 | 5 | 50 | ○ | X | △ | △ | △ |
| pres. 100 | 100 | 10 | 100 | ○ | ○ | ○ | ○ | ○ |
| pres. 100 | 100 | 10 | 150 | ○ | ○ | ○ | ○ | ○ |
| pres. 100 | 100 | 10 | 200 | ○ | △ | ○ | △ | △ |
| pres. 100 | 100 | 20 | 50 | ○ | △ | △ | ○ | △ |
| pres. 100 | 100 | 20 | 100 | ○ | ○ | ○ | ○ | ○ |
| pres. 100 | 100 | 20 | 150 | ○ | ○ | ○ | ○ | ○ |
| pres. 100 | 100 | 20 | 200 | ○ | △ | ○ | △ | △ |
| pres. 100 | 100 | 50 | 50 | ○ | △ | △ | ○ | ○ |
| pres. 100 | 100 | 50 | 100 | ○ | ○ | ○ | ○ | ○ |
| pres. 100 | 100 | 50 | 150 | ○ | ○ | ○ | ○ | ○ |
| pres. 100 | 100 | 50 | 200 | ○ | X | △ | X | △ |
| pres. 100 | 100 | 80 | 50 | X | X | X | X | X |
| pres. 100 | 100 | 80 | 100 | X | X | X | X | X |
| pres. 100 | 100 | 80 | 150 | X | X | X | X | X |
| pres. 100 | 100 | 80 | 200 | X | X | X | X | X |

Comparative Example 11

The following comparison and studies were done to evaluate the photoelectric converting performance of the photovoltaic element made in Embodiment 2.

The thicknesses of the non-crystalline i type silicon layer (the second electrically conductive type layer side), the microcrystalline i type layer and the microcrystalline p type semiconductor layer were variously changed by a procedure similar to that in the embodiment to thereby make a photovoltaic element.

The evaluation of the current-voltage characteristic of the photovoltaic elements made in Embodiment 1 and Comparative Example 5 was effected.

The current-voltage characteristic was evaluated with the central portion of the belt-like member in the widthwise direction thereof cut out from the end portion (5 cm from the end) with an area of 5 cm square, and installed under the application of AM-1.5 (100 mW/cm²) light and with photoelectric conversion efficiency measured.

The result is shown in Table 6. Each value is an arbitrary value when each characteristic of Embodiment 1 is 1.00.

The density of the p type impurity in the microcrystalline p type layer was of the order of $10^{21}$ atoms/cm$^3$ on the surface, and had a distribution in which the density decreased toward the i layer side.

As in the case of Comparative Example 5, the current-voltage characteristic of the element made was measured and evaluated. The result is shown in Table 12.

In the table, when the values of the conversion efficiency, open voltage, short-circuiting current and fill factor are 95% or more of those in the embodiment and the performance is recognized as substantially equal to that in the embodiment, a mark ○ is written, and when said values are 90% to less than 95% and the performance is somewhat inferior, a mark Δ is written, and when said values are less than 90% and the performance is considerably inferior, a mark X is written.

TABLE 12-1

| names of elements | thickness of non-crystalline i type Si layer (nm) | thickness of microcrystalline i type layer (nm) | thickness of microcrystalline p type layer (nm) | conversion efficiency (%) | open voltage (v) | short-circuiting current (mA/cm$^2$) | fill factor |
|---|---|---|---|---|---|---|---|
| embodiment 2 | 100 | 100 | 100 | 1 | 1 | 1 | 1 |
| comp. element 2-1 | 0 | 0 | 50 | X | X | X | X |
| comp. element 2-2 | 0 | 0 | 100 | X | X | X | X |
| comp. element 2-3 | 0 | 0 | 150 | X | X | X | X |
| comp. element 2-4 | 0 | 0 | 200 | X | X | X | X |
| comp. element 2-5 | 0 | 30 | 50 | X | X | X | X |
| comp. element 2-6 | 0 | 30 | 100 | X | X | X | X |
| comp. element 2-7 | 0 | 30 | 150 | X | X | X | X |
| comp. element 2-8 | 0 | 30 | 200 | X | X | X | X |
| comp. element 2-9 | 0 | 50 | 50 | X | X | X | X |
| comp. element 2-10 | 0 | 50 | 100 | X | X | X | X |
| comp. element 2-11 | 0 | 50 | 150 | X | X | X | X |
| comp. element 2-12 | 0 | 50 | 200 | X | X | X | X |
| comp. element 2-13 | 0 | 100 | 50 | X | X | X | X |
| comp. element 2-14 | 0 | 100 | 100 | X | X | X | X |
| comp. element 2-15 | 0 | 100 | 150 | X | X | X | X |
| comp. element 2-16 | 0 | 100 | 200 | X | X | X | X |
| comp. element 2-17 | 0 | 150 | 50 | X | X | X | X |
| comp. element 2-18 | 0 | 150 | 100 | X | X | X | X |
| comp. element 2-19 | 0 | 150 | 150 | X | X | X | X |
| comp. element 2-20 | 0 | 150 | 200 | X | X | X | X |

TABLE 12-2

| names of elements | thickness of non-crystalline i type Si layer (nm) | thickness of microcrystalline i type layer (nm) | thickness of microcrystalline p type layer (nm) | conversion efficiency (%) | open voltage (v) | short-circuiting current (mA/cm$^2$) | fill factor |
|---|---|---|---|---|---|---|---|
| embodiment 2 |  | 100 | 100 | 1 | 1 | 1 | 1 |
| comp. element 2-21 | 30 | 0 | 50 | X | X | X | X |
| comp. element 2-22 | 30 | 0 | 100 | X | X | X | X |
| comp. element 2-23 | 30 | 0 | 150 | X | X | X | X |
| comp. element 2-24 | 30 | 0 | 200 | X | X | X | X |
| comp. element 2-25 | 30 | 30 | 50 | X | X | X | X |
| comp. element 2-26 | 30 | 30 | 100 | X | X | X | X |
| comp. element 2-27 | 30 | 30 | 150 | X | X | X | X |
| comp. element 2-28 | 30 | 30 | 200 | X | X | X | X |
| comp. element 2-29 | 30 | 50 | 50 | X | X | X | X |
| comp. element 2-30 | 30 | 50 | 100 | X | X | X | X |
| comp. element 2-31 | 30 | 50 | 150 | X | X | X | X |
| comp. element 2-32 | 30 | 50 | 200 | X | X | X | X |
| comp. element 2-33 | 30 | 100 | 50 | X | X | X | X |
| comp. element 2-34 | 30 | 100 | 100 | X | X | X | X |
| comp. element 2-35 | 30 | 100 | 150 | X | X | X | X |
| comp. element 2-36 | 30 | 100 | 200 | X | X | X | X |
| comp. element 2-37 | 30 | 150 | 50 | X | X | X | X |
| comp. element 2-38 | 30 | 150 | 100 | X | X | X | X |
| comp. element 2-39 | 30 | 150 | 150 | X | X | X | X |
| comp. element 2-40 | 30 | 150 | 200 | X | X | X | X |

TABLE 12-3

| names of elements | thickness of non-crystalline i type Si layer (nm) | thickness of microcrystalline i type layer (nm) | thickness of microcrystalline p type layer (nm) | conversion efficiency (%) | open voltage (v) | short-circuiting current (mA/cm²) | fill factor |
|---|---|---|---|---|---|---|---|
| embodiment 2 | 100 | 100 | 100 | 1 | 1 | 1 | 1 |
| comp. element 2-41 | 50 | 0 | 50 | | | | |
| comp. element 2-42 | 50 | 0 | 100 | | | | |
| comp. element 2-43 | 50 | 0 | 150 | | | | |
| comp. element 2-44 | 50 | 0 | 200 | | | | |
| comp. element 2-45 | 50 | 30 | 50 | | | | |
| comp. element 2-46 | 50 | 30 | 100 | | | | |
| comp. element 2-47 | 50 | 30 | 150 | | | | |
| comp. element 2-48 | 50 | 30 | 200 | | | | |
| comp. element 2-49 | 50 | 50 | 50 | | | | |
| comp. element 2-50 | 50 | 50 | 100 | ○ | ○ | ○ | ○ |
| comp. element 2-51 | 50 | 50 | 150 | ○ | ○ | ○ | ○ |
| comp. element 2-52 | 50 | 50 | 200 | | | | |
| comp. element 2-53 | 50 | 100 | 50 | | | | |
| comp. element 2-54 | 50 | 100 | 100 | ○ | ○ | ○ | ○ |
| comp. element 2-55 | 50 | 100 | 150 | ○ | ○ | ○ | ○ |
| comp. element 2-56 | 50 | 100 | 200 | | | | |
| comp. element 2-57 | 50 | 150 | 50 | | | | |
| comp. element 2-58 | 50 | 150 | 100 | | | | |
| comp. element 2-59 | 50 | 150 | 150 | | | | |
| comp. element 2-60 | 50 | 150 | 200 | | | | |

TABLE 12-4

| names of elements | thickness of non-crystalline i type Si layer (nm) | thickness of microcrystalline i type layer (nm) | thickness of microcrystalline p type layer (nm) | conversion efficiency (%) | open voltage (v) | short-circuiting current (mA/cm²) | fill factor |
|---|---|---|---|---|---|---|---|
| embodiment 2 | 100 | 100 | 100 | 1 | 1 | 1 | 1 |
| comp. element 2-61 | 100 | 0 | 50 | | | | |
| comp. element 2-62 | 100 | 0 | 100 | | | | |
| comp. element 2-63 | 100 | 0 | 150 | | | | |
| comp. element 2-64 | 100 | 0 | 200 | | | | |
| comp. element 2-65 | 100 | 30 | 50 | | | | |
| comp. element 2-66 | 100 | 30 | 100 | | | | |
| comp. element 2-67 | 100 | 30 | 150 | | | | |
| comp. element 2-68 | 100 | 30 | 200 | | | | |
| comp. element 2-69 | 100 | 50 | 50 | | | | |
| comp. element 2-70 | 100 | 50 | 100 | ○ | ○ | ○ | ○ |
| comp. element 2-71 | 100 | 50 | 150 | ○ | ○ | ○ | ○ |
| comp. element 2-72 | 100 | 50 | 200 | | | | |
| comp. element 2-73 | 100 | 100 | 50 | | | | |
| embodiment 2 | 100 | 100 | 100 | 1 | 1 | 1 | 1 |
| comp. element 2-74 | 100 | 100 | 150 | ○ | ○ | ○ | ○ |
| comp. element 2-75 | 100 | 100 | 200 | | | | |
| comp. element 2-76 | 100 | 150 | 50 | | | | |
| comp. element 2-77 | 100 | 150 | 100 | | | | |
| comp. element 2-78 | 100 | 150 | 150 | | | | |
| comp. element 2-79 | 100 | 150 | 200 | | | | |

TABLE 12-5

| names of elements | thickness of non-crystalline i type Si layer (nm) | thickness of microcrystalline i type layer (nm) | thickness of microcrystalline p type layer (nm) | conversion efficiency (%) | open voltage (v) | short-circuiting current (mA/cm²) | fill factor |
|---|---|---|---|---|---|---|---|
| embodiment 2 | 100 | 100 | 100 | 1 | 1 | 1 | 1 |
| comp. element 2-80 | 150 | 0 | 50 | | | | |
| comp. element 2-81 | 150 | 0 | 100 | | | | |
| comp. element 2-82 | 150 | 0 | 150 | | | | |
| comp. element 2-83 | 150 | 0 | 200 | | | | |
| comp. element 2-84 | 150 | 30 | 50 | | | | |
| comp. element 2-85 | 150 | 30 | 100 | | | | |

TABLE 12-5-continued

| names of elements | thickness of non-crystalline i type Si layer (nm) | thickness of microcrystalline i type layer (nm) | thickness of microcrystalline p type layer (nm) | conversion efficiency (%) | open voltage (v) | short-circuiting current (mA/cm$^2$) | fill factor |
|---|---|---|---|---|---|---|---|
| comp. element 2-86 | 150 | 30 | 150 | | | | |
| comp. element 2-87 | 150 | 30 | 200 | | | | |
| comp. element 2-88 | 150 | 50 | 50 | | | | |
| comp. element 2-89 | 150 | 50 | 100 | ◯ | ◯ | ◯ | ◯ |
| comp. element 2-90 | 150 | 50 | 150 | ◯ | ◯ | ◯ | ◯ |
| comp. element 2-91 | 150 | 50 | 200 | | | | |
| comp. element 2-92 | 150 | 100 | 50 | | | | |
| comp. element 2-93 | 150 | 100 | 100 | ◯ | ◯ | ◯ | ◯ |
| comp. element 2-94 | 150 | 100 | 150 | ◯ | ◯ | ◯ | ◯ |
| comp. element 2-95 | 150 | 100 | 200 | | | | |
| comp. element 2-96 | 150 | 150 | 50 | | | | |
| comp. element 2-97 | 150 | 150 | 100 | | | | |
| comp. element 2-98 | 150 | 150 | 150 | | | | |
| comp. element 2-99 | 150 | 150 | 200 | | | | |

TABLE 12-6

| names of elements | thickness of non-crystalline i type Si layer (nm) | thickness of microcrystalline i type layer (nm) | thickness of microcrystalline p type layer (nm) | conversion efficiency (%) | open voltage (v) | short-circuiting current (mA/cm$^2$) | fill factor |
|---|---|---|---|---|---|---|---|
| embodiment 2 | 100 | 100 | 100 | 1 | 1 | 1 | 1 |
| comp. element 2-100 | 200 | 0 | 50 | X | X | X | X |
| comp. element 2-101 | 200 | 0 | 100 | X | X | X | X |
| comp. element 2-102 | 200 | 0 | 150 | X | X | X | X |
| comp. element 2-103 | 200 | 0 | 200 | X | X | X | X |
| comp. element 2-104 | 200 | 30 | 50 | X | X | X | X |
| comp. element 2-105 | 200 | 30 | 100 | X | X | X | X |
| comp. element 2-106 | 200 | 30 | 150 | X | X | X | X |
| comp. element 2-107 | 200 | 30 | 200 | X | X | X | X |
| comp. element 2-108 | 200 | 50 | 50 | X | X | X | X |
| comp. element 2-109 | 200 | 50 | 100 | X | X | X | X |
| comp. element 2-110 | 200 | 50 | 150 | X | X | X | X |
| comp. element 2-111 | 200 | 50 | 200 | X | X | X | X |
| comp. element 2-112 | 200 | 100 | 50 | X | X | X | X |
| comp. element 2-113 | 200 | 100 | 100 | X | X | X | X |
| comp. element 2-114 | 200 | 100 | 150 | X | X | X | X |
| comp. element 2-115 | 200 | 100 | 200 | X | X | X | X |
| comp. element 2-116 | 200 | 150 | 50 | X | X | X | X |
| comp. element 2-117 | 200 | 150 | 100 | X | X | X | X |
| comp. element 2-118 | 200 | 150 | 150 | X | X | X | X |
| comp. element 2-119 | 200 | 150 | 200 | X | X | X | X |

As regards the current-voltage characteristic such as conversion efficiency, high photoelectric conversion efficiency was obtained in a photovoltaic element in which the layer thickness of the non-microcrystalline i type Si semiconductor layer was 50–100 Å, the layer thickness of the microcrystalline i type layer was 50–100 Å and the layer thickness of the microcrystalline p type semiconductor layer was 100–150 Å (from a detailed experiment, it was found that 80–150 Å was suitable).

From Embodiment 2 and the Comparative examples, the excellence of the photoelectric conversion characteristic of the SiGe single cell type photovoltaic element made on the basis of the present invention is shown.

Embodiment 3

A triple cell continuously forming apparatus using the plasma CVD method adopting the roll to roll system as shown in FIG. 3 was used for the formation of semiconductor layers.

In FIG. 3, the reference numeral 301 generally designates an accumulated film forming apparatus. The reference numeral 302 denotes a long electrically conductive magnetic material belt-like member, the reference numeral 303 designates a pay-away chamber for the belt-like member, the reference numeral 304 denotes a take-up chamber for the belt-like member, the reference numeral 305 designates a bottom cell making portion, the reference numeral 306 denotes a middle cell making portion, the reference numeral 307 denotes a top cell making portion, the reference numerals 308, 314 and 320 designate n type semiconductor layer forming chambers, the reference numerals 309, 315 and 321 denote non-crystalline i type Si layer forming chambers, the reference numeral 310, 311, 316 and 317 designate non-crystal i type SiGe layer forming chambers, the reference numerals 312, 318 and 322 denote microcrystalline i type Si layer forming chambers, and the reference numerals 313, 319 and 323 designate microcrystalline p type semiconductor layer forming chambers.

The reference numeral 325 denotes a discharge furnace. The reference numeral 324 designates a gas gate, and the reference numerals 326 and 327 denote bobbins. The bottom cell making portion and the middle cell making portion adopt apparatus example 2, and the top cell making portion adopts apparatus example 1.

Figure 11:
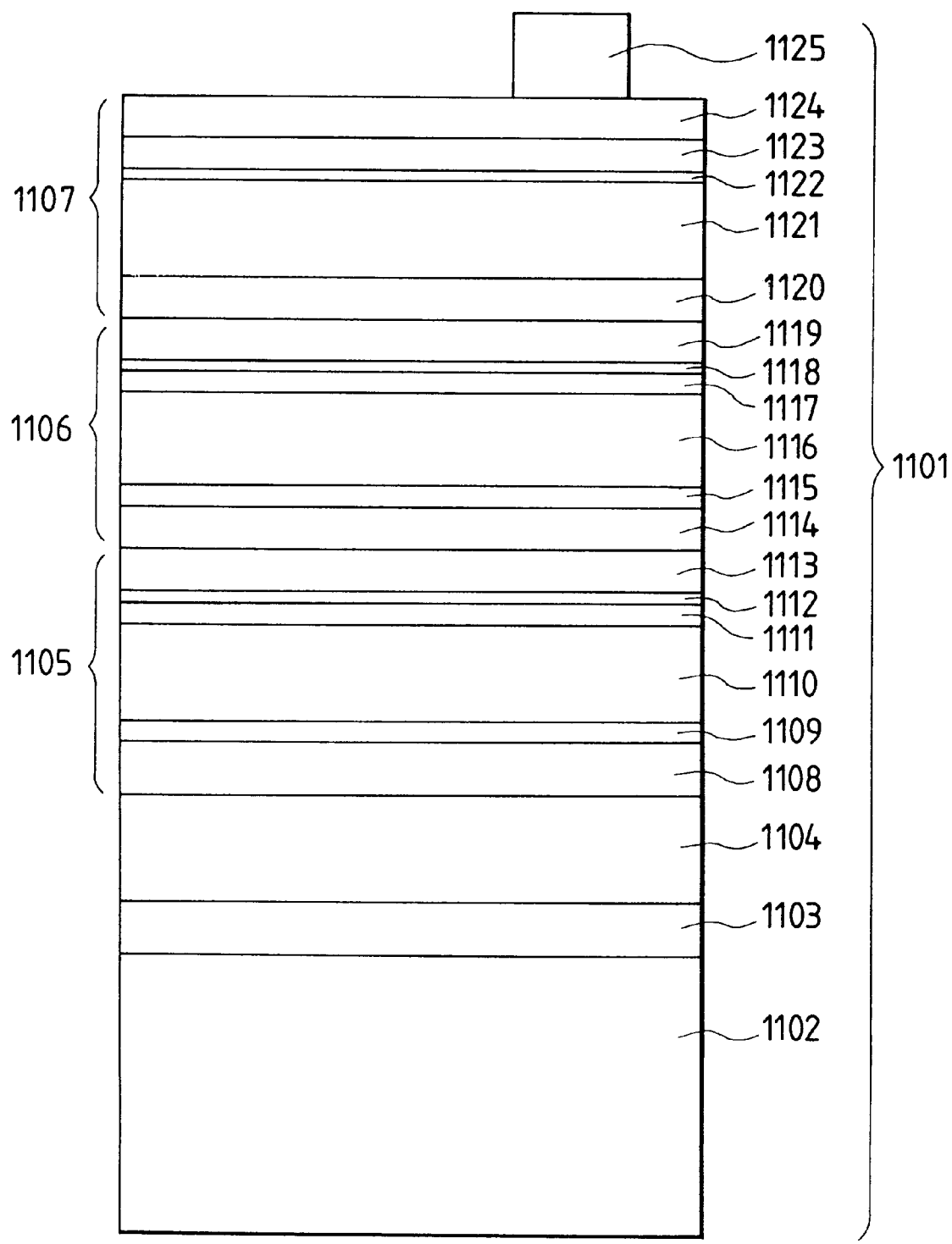
FIG. 11 shows the layer construction of an SiGe\SiGe\Si triple cell type photovoltaic element made by the apparatus of the present invention.

By the use of the apparatus of FIG. 3, an SiGe\SiGe\Si triple cell type photovoltaic element 1101 having a layer construction shown in FIG. 11 was made by a procedure similar to that in Embodiments 1 and 2 under the conditions of Table 13 below.

This photovoltaic element 1101 is constructed by laminating a back reflecting layer 1103, a reflection increasing layer 1104, a bottom SiGe cell 1105 (an n type semiconductor layer 1108, a non-crystalline i type Si semiconductor buffer layer 1109, a non-crystalline i type SiGe semiconductor layer 1110, a non-crystalline i type SiGe semiconductor buffer layer 1111, a microcrystalline i type semiconductor buffer layer 1112 and a microcrystalline p type semiconductor layer 1113), a middle SiGe cell 1106 (an n type semiconductor layer 1114, a non-crystalline i type Si semiconductor buffer layer 1115, a non-crystalline i type SiGe semiconductor layer 1116, a non-crystalline i type SiGe semiconductor buffer layer 1117, a microcrystalline i type semiconductor buffer layer 1118 and a microcrystalline p type semiconductor layer 1119), a top Si cell 1107 (an n type semiconductor layer 1120, a non-crystalline i type Si semiconductor layer 1121, a microcrystalline i type Si semiconductor buffer layer 1122 and a microcrystalline p type semiconductor layer 1123), transparent electrically conductive film 1124 and a current collecting electrode 1125 on an electrically conductive belt-like member (SUS 430) 1102.

TABLE 13 substrate: SUS 430 BA, thickness 0.13 mm
reflecting layer: aluminum (Al) thin film 100 nm
reflection increasing layer: zinc oxide (ZnO) thin film 1 μm
gate gas: 700 sccm from each gate

| name of layers | thickness of each layer (nm) | gas used and flow rate (sccm) | | RF, MW electric power (w) | pressure (Torr) | substrate temperature (° C.) |
|---|---|---|---|---|---|---|
| n type Si layer | 40 | $SiH_4$ | 250 | RF 500 | 1.2 | 350 |
| | | $PH_3/H_2$ (2% diluted) | 1000 | | | |
| | | $H_2$ | 1000 | | | |
| non-crystalline i type Si layer | 15 | $SiH_4$ | 75 | RF 200 | 1.3 | 320 |
| | | $H_2$ | 1500 | | | |
| non-crystalline type SiGe layer | 120 | $SiH_4$ | 100 | MW 500 | 0.01 | 320 |
| | | $GeH_4$ | 140 | RF 2000 | | |
| | | $H_2$ | 750 | | | |
| non-crystalline i type Si layer | 10 | $SiH_4$ | 40 | RF 300 | 1.3 | 320 |
| | | $H_2$ | 2500 | | | |
| microcrystalline i type Si layer | 10 | $SiH_4$ | 25 | RF 1000 | 1.3 | 300 |
| | | $H_2$ | 2500 | | | |
| microcrystalline p type Si layer | 10 | $SiH_4$ | 10 | RF 2000 | 1.2 | 250 |
| | | $BF_3/H_2$ (2% diluted) | 500 | | | |
| | | $H_2$ | 2500 | | | |
| n type Si layer | 15 | $SiH_4$ | 100 | RF 150 | 1.2 | 300 |
| | | $PH_3/H_2$ (2% diluted) | 300 | | | |
| | | $H_2$ | 3000 | | | |
| non-crystalline i type Si layer | 15 | $SiH_4$ | 75 | RF 200 | 1.3 | 320 |
| | | $H_2$ | 1500 | | | |
| non-crystalline i type SiGe layer | 120 | $SiH_4$ | 125 | MW 500 | 0.01 | 320 |
| | | $GeH_4$ | 100 | RF 2000 | | |
| | | $H_2$ | 750 | | | |
| non-crystalline i type Si layer | 15 | $SiH_4$ | 40 | RF 300 | 1.3 | 320 |
| | | $H_2$ | 2500 | | | |
| microcrystalline i type Si layer | 10 | $SiH_4$ | 25 | RF 1000 | 1.3 | 300 |
| | | $H_2$ | 2500 | | | |
| microcrystalline p type Si layer | 10 | $SiH_4$ | 10 | RF 2000 | 1.2 | 250 |
| | | $BF_3/H_2$ (2% diluted) | 500 | | | |
| | | $H_2$ | 2500 | | | |
| n type Si layer | 15 | $SiH_4$ | 100 | RF 200 | 1.2 | 300 |
| | | $PH_3/H_2$ (2% diluted) | 300 | | | |
| | | $H_2$ | 3000 | | | |
| non-crystalline i type Si layer | 140 | $SiH_4$ | 400 | RF 800 | 1.5 | 200 |
| | | $H_2$ | 2000 | | | |
| microcrystalline i type Si layer | 10 | $SiH_4$ | 10 | RF 1000 | 1.3 | 200 |
| | | $H_2$ | 1200 | | | |
| microcrystalline p type Si layer | 10 | $SiH_4$ | 40 | RF 1500 | 1.2 | 200 |
| | | $BF_3/H_2$ (2% diluted) | 400 | | | |
| | | $H_2$ | 4000 | | | | transparent electrode: ITO ($In_2O_3$ + $SnO_2$) thin film 80 nm
current collecting electrode: aluminum (Al) think film 2 μm For comparison, a SiGe\SiGe\Si triple cell type photovoltaic element, (element-E) having the layer construction shown in FIG. 1 in which the microcrystalline i type layer was not interposed in the triple cell of Embodiment 3 was made by a procedure similar to that in Embodiment 3 without the microcrystalline i type Si layer forming chamber being used (without discharge being caused).

Also, a SiGe\SiGe\Si triple cell type photovoltaic element (element-F) in which instead of the microcrystalline i type layer, a non-crystalline i type layer of the same layer thickness was formed by the microcrystalline i type layer forming chamber was made by a procedure similar to that in Embodiment 3.

The current-voltage characteristic of the photovoltaic elements made in Embodiment 3 (element-Embodiment 3) and Comparative Example 12 (elements-E and F) was evaluated in the same manner as in Embodiment 1. The evaluated result is shown in Table 14 below.

TABLE 14

| names of elements | conversion efficiency (%) | open voltage (V) | short-circuiting current (mA/cm$^2$) | fill factor |
|---|---|---|---|---|
| (element-Emb. 3) | 1.04 | 1.01 | 1.01 | 1.02 |
| (element-E) | 1 | 1 | 1 | 1 |
| (element-F) | 0.93 | 1 | 1.02 | 0.92 |

As shown in Table 14, the photovoltaic element of Embodiment 3 (element-Embodiment 3) is excellent in conversion efficiency relative to the photoelectromotive element of Comparative Example 12 (elements-E and F), and it has been found that the photovoltaic element made by the method of the present invention has an excellent characteristic, and the effect of the present invention has been proved.

Comparative Example 13

The following comparison and studies were done to evaluate the photoelectric converting performance of the photovoltaic element made in Embodiment 3.

By a procedure similar to that in the embodiment, the thicknesses of the microcrystalline i type layer and microcrystalline p type semiconductor layer in the bottom cell and middle cell were variously changed to thereby make a photovoltaic element.

The evaluation of the current-voltage characteristic of the photovoltaic elements made in Embodiment 3 and the comparative example was effected.

The current-voltage characteristic was evaluated with the central portion of the belt-like member in the widthwise direction thereof cut out from the end portion (5 cm from the end) with an area of 5 cm square, and installed under the application of AM-1.5 (100 mW/cm$^2$) light and with the photoelectric conversion efficiency measured. The result is shown in Table 6. Each value is an arbitrary value when each characteristic of Embodiment 1 is 1.00.

The density of the p type impurity in the microcrystalline p type layer was of the order of $10^{21}$ atoms/cm$^3$ on the surface and had a distribution in which the density decreased toward the i layer side.

As in the case of Comparative Example 5, the current-voltage characteristic of the element made was measured and evaluated. The result is shown in Table 15 below.

In the table, when the values of the open voltage and fill factor are 95% or more of those of the embodiment and the performance is recognized as being substantially equal to that of the embodiment, a mark ○ is written, and when said values are 90% to less than 95% and the performance is somewhat inferior, a mark Δ is written, and when said values are less than 90% and the performance is considerably inferior, a mark X is written.

TABLE 15

| names of elements | thickness of microcrystalline i type layer (nm) | thickness of microcrystalline p type layer (nm) | open voltage (v) | fill factor |
|---|---|---|---|---|
| comp. element 3-1 | 0 | 100 | Δ | Δ |
| comp. element 3-2 | 0 | 150 | Δ | Δ |
| comp. element 3-3 | 0 | 200 | Δ | Δ |
| comp. element 3-4 | 30 | 100 | Δ | Δ |
| comp. element 3-5 | 30 | 150 | Δ | Δ |
| comp. element 3-6 | 30 | 200 | Δ | Δ |
| comp. element 3-7 | 50 | 100 | ○ | ○ |
| comp. element 3-8 | 50 | 150 | ○ | ○ |
| comp. element 3-9 | 50 | 200 | ○ | Δ |
| comp. element 3-10 | 100 | 50 | Δ | Δ |
| embodiment 1 | 100 | 100 | 1 | 1 |
| comp. element 3-11 | 100 | 150 | ○ | ○ |
| comp. element 3-12 | 100 | 200 | Δ | X |
| comp. element 3-13 | 150 | 100 | Δ | X |
| comp. element 3-14 | 150 | 150 | Δ | X |
| comp. element 3-15 | 150 | 200 | Δ | X |
| comp. element 3-16 | 200 | 100 | X | X |
| comp. element 3-17 | 200 | 150 | X | X |
| comp. element 3-18 | 200 | 200 | X | X |

Again in the current-voltage characteristic of the triple cell, high photoelectric conversion efficiency was obtained under the condition that the layer thickness of the microcrystalline i type layer was 50–100 Å and the layer thickness of the microcrystalline p type semiconductor layer was 100–150 Å (from a detailed experiment, it has been found that 80–150 Å is suitable).

From Embodiment 3 and the comparative example, the excellence of the photoelectric conversion characteristic of the tandem cell type photovoltaic element made on the basis of the present invention is shown.

As described above, according to the present invention, in a pin-junctioned photovoltaic element, it becomes possible to improve the grating consistency of the non-crystalline i type semiconductor layer and the microcrystalline second electrically conductive type semiconductor layer by a construction having a microcrystalline i type semiconductor layer, and a photovoltaic element having an excellent current-voltage characteristic and excellent photoelectric conversion efficiency can be constructed.

Also, the layer thickness of the microcrystalline second electrically conductive type semiconductor layer can be made smaller by the microcrystalline i type semiconductor layer, and in the photoelectric conversion characteristic of the photovoltaic element, the short-circuiting current can be increased and the fill factor can be improved.

Further, by the microcrystalline i type semiconductor layer, it can be suppressed that during the making of the element, the second electrically conductive type impurity diffuses from the microcrystalline second electrically conductive type semiconductor layer into the non-crystalline i type layer, and the uniformity and reproducibility of the performance of the element during the manufacture thereof can be more improved, and it becomes possible to mass-produce photovoltaic elements efficiently.

Also, in the manufacture of the element, for the formation of the microcrystalline p type semiconductor layer, $SiH_4$, $H_2$ and $BF_3$ are used as the raw material gas, and the amount of supply of $H_2$ to $SiH_4$ is 50 times or greater, and the amount of supply of $BF_3$ to $SiH_4$ is 10 to 50%, and the magnitude of the high frequency electric power applied to the raw material gas is 0.01 to 0.03 W/cm$^2$, whereby the grating consistency between the non-crystalline i type semiconductor layer and the microcrystalline second electrically conductive type semiconductor layer can be more improved.

Also, design is made such that in the manufacture of the element, for the formation of the microcrystalline i type semiconductor layer, the raw material gas is made to flow from the upper part to the lower part in the direction of movement of the belt-like member and for the formation of the microcrystalline second electrically conductive type semiconductor layer, the raw material gas is made to flow from the lower part to the upper part in the direction of movement of the belt-like member, whereby the grating consistency of the microcrystalline i type semiconductor layer and the microcrystalline second electrically conductive semiconductor layer and further the grating consistency between the non-crystalline i type semiconductor layer and the microcrystalline i type semiconductor layer can be improved.

Further, in the manufacture of the element, the area of the electrode for applying electric power for causing plasma is made larger than the area of the substrate in the accumulation chamber, whereby it becomes possible to expedite the formation of the microcrystalline second electrically conductive type semiconductor layer.

What is claimed is:

1. A method of manufacturing a photovoltaic element characterized by forming a first electrically conductive type semiconductor layer on a long substrate, forming a non-crystalline i type semiconductor layer thereon, forming a microcrystalline i type semiconductor layer thereon by the high frequency plasma CVD method, and forming a microcrystalline second electrically conductive type semiconductor layer thereon by the high frequency plasma CVD method.

2. A method according to claim 1, characterized in that $SiH_4$ and $H_2$ are used as raw material gas for the formation of said microcrystalline i type semiconductor layer, the amount of supply of said $H_2$ to said $SiH_4$ is 50 times or greater, and the magnitude of high frequency electric power applied to said raw material gas is 0.2 W/cm$^2$ or greater.

3. A method according to claim 1, characterized in that $SiH_4$, $H_2$ and $BF_3$ are used as raw material gas for the formation of said microcrystalline second electrically conductive type semiconductor layer, the amount of supply of said $H_2$ to said $SiH_4$ is 50 times or greater, the amount of supply of said $BF_3$ to said $SiH_4$ is 10 to 50%, and the magnitude of high frequency electric power applied to said raw material gas is 0.01 to 0.03 W/cm$^2$.

4. A method according to claim 1, characterized in that the formation temperature of said microcrystalline i type semiconductor layer is below the formation temperature of said non-crystalline i type semiconductor layer, and the formation temperature of said microcrystalline i type semiconductor layer is 180 to 240° C.

5. A method according to claim 1, characterized in that said non-crystalline i type semiconductor layer is formed by the microwave plasma CVD method.

6. A method according to claim 1, characterized in that said non-crystalline i type semiconductor layer has an i type layer formed by the microwave plasma CVD method, and an i type layer formed by the high frequency plasma CVD method.

* * * * *

UNITED STATES PATENT AND TRADEMARK OFFICE
CERTIFICATE OF CORRECTION

PATENT NO. : 6,368,944 B1
DATED : April 9, 2002
INVENTOR(S) : Shotaro Okabe et al.

It is certified that error appears in the above-identified patent and that said Letters Patent is hereby corrected as shown below:

Column 1,
Line 32, "great" should read -- great, --.

Column 9,
Line 8, "+V" should read -- +30V --.

Column 11,
Line 43, "there" should read -- was --.
Line 44, "was" should read -- there --.

Column 16,
Line 5, "(element-Embodiment 1." should read -- (element-Embodiment 1). --; and
Table 1, "think film" should read -- thin film --.

Column 21,
Line 28, "W/CM$^3$," should read -- W/cm$^3$, --.

Column 23,
Table 6, "density of p layer" should read -- density of p type --.

Column 27,
Table 9, "Torr" should read -- (Torr) --.

Column 31,
Table 11-5, "5" should read -- 10 --.

UNITED STATES PATENT AND TRADEMARK OFFICE
CERTIFICATE OF CORRECTION

PATENT NO.   : 6,368,944 B1
DATED        : April 9, 2002
INVENTOR(S)  : Shotaro Okabe et al.

It is certified that error appears in the above-identified patent and that said Letters Patent is hereby corrected as shown below:

Column 32,
Table 11-2, "○" should read -- Δ --.

Column 39,
Table 13, "name of layers" should read -- names of layers --.

Signed and Sealed this

Third Day of December, 2002

JAMES E. ROGAN
*Director of the United States Patent and Trademark Office*